(12) United States Patent
Ahn et al.

(10) Patent No.: US 7,045,430 B2
(45) Date of Patent: May 16, 2006

(54) ATOMIC LAYER-DEPOSITED LAALO₃ FILMS FOR GATE DIELECTRICS

(75) Inventors: Kie Y. Ahn, Chappaqua, NY (US); Leonard Forbes, Corvallis, OR (US)

(73) Assignee: Micron Technology Inc., Boise, ID (US)

( * ) Notice: Subject to any disclaimer, the term of this patent is extended or adjusted under 35 U.S.C. 154(b) by 112 days.

(21) Appl. No.: 10/137,499

(22) Filed: May 2, 2002

(65) Prior Publication Data
US 2003/0207540 A1 Nov. 6, 2003

(51) Int. Cl.
*H01L 21/00* (2006.01)
*H01L 21/336* (2006.01)
*H01L 21/4763* (2006.01)

(52) U.S. Cl. .................. 438/287; 438/643; 438/3
(58) Field of Classification Search ........... 438/287, 438/643, 618, 624, 642, 652, 653, 3
See application file for complete search history.

(56) References Cited

U.S. PATENT DOCUMENTS

| | | | |
|---|---|---|---|
| 4,058,430 A | 11/1977 | Suntola et al. | 427/255.13 |
| 4,215,156 A | 7/1980 | Dalal et al. | 427/84 |
| 4,333,808 A | 6/1982 | Bhattacharyya et al. | 204/192 D |
| 4,394,673 A | 7/1983 | Thompson et al. | 357/15 |
| 4,399,424 A | 8/1983 | Rigby | 338/34 |
| 4,413,022 A | 11/1983 | Suntola et al. | 427/255.2 |
| 4,647,947 A | 3/1987 | Takeoka et al. | 346/135.1 |
| 4,725,877 A | 2/1988 | Brasen et al. | 257/751 |
| 4,920,071 A | 4/1990 | Thomas | 437/188 |
| 5,055,319 A | 10/1991 | Bunshah et al. | 427/38 |
| 5,080,928 A | 1/1992 | Klinedinst et al. | 427/70 |
| 5,198,029 A | 3/1993 | Dutta et al. | 118/303 |
| 5,496,597 A | 3/1996 | Soininen et al. | |
| 5,595,606 A | 1/1997 | Fujikawa et al. | 118/725 |
| 5,698,022 A | 12/1997 | Glassman et al. | |
| 5,795,808 A | 8/1998 | Park | 438/301 |

(Continued)

FOREIGN PATENT DOCUMENTS

| | | |
|---|---|---|
| EP | 1096042 | 5/2001 |
| EP | 1124262 | 8/2001 |
| JP | 11-335849 | 12/1999 |
| JP | 2001-332546 | 11/2001 |
| WO | WO-02/31875 | 4/2002 |
| WO | WO-0233729 A2 | 4/2002 |
| WO | WO-02/43115 | 5/2002 |

OTHER PUBLICATIONS

Kim et al., "Atomic Control of Substrate Termination and Heteroepitaxial Growth of SrTiO3/LaAlO3 Films" Jun. 2000, Journal of the Korean Physical Society, vol. 36 No. 6, pp. 444–448.

(Continued)

*Primary Examiner*—John F. Niebling
*Assistant Examiner*—Walter L. Lindsay
(74) *Attorney, Agent, or Firm*—Schwegman, Lundberg, Woessner & Kluth, P.A.

(57) ABSTRACT

A dielectric film containing $LaAlO_3$ and method of fabricating a dielectric film contained $LaAlO_3$ produce a reliable gate dielectric having a thinner equivalent oxide thickness than attainable using $SiO_2$. The $LaAlO_3$ gate dielectrics formed are thermodynamically stable such that these gate dielectrics will have minimal reactions with a silicon substrate or other structures during processing. A $LaAlO_3$ gate dielectric is formed by atomic layer deposition employing a lanthanum sequence and an aluminum sequence. A lanthanum sequence uses $La(thd)_3$ (thd=2,2,6,6-tetramethyl-3,5-heptanedione) and ozone. An aluminum sequence uses either trimethylaluminum, $Al(CH_3)_3$, or DMEAA, an adduct of alane ($AlH_3$) and dimethylethylamine $[N(CH_3)_2(C_2H_5)]$, with distilled water vapor.

53 Claims, 8 Drawing Sheets

U.S. PATENT DOCUMENTS

| | | |
|---|---|---|
| 5,801,105 A | 9/1998 | Yano et al. .................. 438/785 |
| 5,810,923 A | 9/1998 | Yano et al. .................... 117/84 |
| 5,822,256 A | 10/1998 | Bauer et al. ................. 365/200 |
| 5,828,080 A | 10/1998 | Yano et al. .................... 257/43 |
| 5,840,897 A | 11/1998 | Kirlin et al. .................... 546/2 |
| 5,916,365 A | 6/1999 | Sherman ...................... 117/92 |
| 5,972,847 A | 10/1999 | Feenstra et al. ............. 505/473 |
| 6,010,969 A | 1/2000 | Vaartstra ..................... 438/758 |
| 6,013,553 A | 1/2000 | Wallace et al. ............. 438/287 |
| 6,020,024 A | 2/2000 | Maiti et al. ................ 427/248.1 |
| 6,027,961 A | 2/2000 | Maiti et al. .................. 438/199 |
| 6,057,271 A | 5/2000 | Kenjiro et al. ......... 204/192.24 |
| 6,093,944 A | 7/2000 | VanDover ................... 257/310 |
| 6,110,529 A | 8/2000 | Gardiner et al. ............. 427/250 |
| 6,171,900 B1 | 1/2001 | Sun ............................. 438/240 |
| 6,203,613 B1 | 3/2001 | Gates et al. ................. 117/104 |
| 6,203,726 B1 | 3/2001 | Danielson et al. .......... 252/301 |
| 6,207,589 B1 | 3/2001 | Ma et al. ..................... 438/785 |
| 6,211,035 B1 | 4/2001 | Moise et al. ................ 438/396 |
| 6,225,168 B1 | 5/2001 | Gardner et al. ............. 438/287 |
| 6,225,237 B1 | 5/2001 | Vaartstra ..................... 438/778 |
| 6,273,951 B1 | 8/2001 | Vaartstra ..................... 117/104 |
| 6,297,539 B1 | 10/2001 | Ma et al. ..................... 257/410 |
| 6,303,481 B1 | 10/2001 | Park ............................ 438/591 |
| 6,368,398 B1 | 4/2002 | Vaartstra ................ 106/287.18 |
| 6,368,941 B1 | 4/2002 | Chen et al. .................. 438/424 |
| 6,380,579 B1 | 4/2002 | Nam et al. ................... 438/395 |
| 6,387,712 B1 | 5/2002 | Yano et al. ...................... 438/3 |
| 6,391,769 B1 | 5/2002 | Lee et al. .................... 438/643 |
| 6,395,650 B1 | 5/2002 | Callegari et al. |
| 6,404,027 B1 | 6/2002 | Hong et al. |
| 6,420,230 B1 | 7/2002 | Derderian et al. |
| 6,432,779 B1 | 8/2002 | Hobbs et al. ................ 438/287 |
| 6,436,203 B1 | 8/2002 | Kaizuka et al. ............. 148/512 |
| 6,441,417 B1 | 8/2002 | Zhang et al. |
| 6,445,023 B1 | 9/2002 | Vaartstra et al. ............ 257/295 |
| 6,448,192 B1 | 9/2002 | Kaushik ...................... 438/785 |
| 6,451,641 B1 | 9/2002 | Halliyal et al. ............. 438/200 |
| 6,451,695 B1 | 9/2002 | Sneh ............................ 438/685 |
| 6,452,229 B1 | 9/2002 | Krivokapic |
| 6,458,701 B1 | 10/2002 | Chae et al. .................. 438/680 |
| 6,465,334 B1 | 10/2002 | Buynoski et al. ........... 438/591 |
| 6,482,740 B1 | 11/2002 | Soininen et al. ............ 438/686 |
| 6,495,436 B1 | 12/2002 | Ahn et al. ................... 438/591 |
| 6,521,911 B1 | 2/2003 | Parsons et al. ................ 257/52 |
| 6,531,324 B1 | 3/2003 | Hsu et al. |
| 6,531,354 B1 | 3/2003 | Maria et al. ................. 438/216 |
| 6,537,613 B1 | 3/2003 | Senzaki et al. ............. 427/250 |
| 6,555,879 B1 | 4/2003 | Krivokapic et al. |
| 6,586,349 B1 | 7/2003 | Jeon et al. ................... 438/785 |
| 6,602,720 B1 | 8/2003 | Hsu et al. |
| 6,620,670 B1 | 9/2003 | Song et al. .................. 438/216 |
| 6,627,260 B1 | 9/2003 | Derderian et al. |
| 6,645,882 B1 | 11/2003 | Halliyal et al. ............. 438/785 |
| 6,660,660 B1 | 12/2003 | Haukka et al. .............. 438/778 |
| 6,713,846 B1 | 3/2004 | Senzaki ....................... 257/635 |
| 6,730,575 B1 | 5/2004 | Eldridge ..................... 257/310 |
| 6,750,066 B1 | 6/2004 | Cheung et al. .................. 438/3 |
| 6,950,340 B1 | 9/2005 | Bhattacharyya |
| 6,952,032 B1 | 10/2005 | Forbes et al. |
| 6,979,855 B1 | 12/2005 | Ahn et al. |
| 2002/0001971 A1 | 1/2002 | Cho ............................ 438/765 |
| 2002/0024108 A1 | 2/2002 | Lucovsky et al. |
| 2002/0025628 A1 | 2/2002 | Derderian et al. |
| 2002/0089023 A1 | 7/2002 | Yu et al. ...................... 257/411 |
| 2002/0111001 A1 | 8/2002 | Ahn et al. ................... 438/592 |
| 2002/0122885 A1 | 9/2002 | Ahn ........................ 427/255.28 |
| 2002/0155688 A1 | 10/2002 | Ahn et al. ................... 438/592 |
| 2002/0155689 A1 | 10/2002 | Ahn et al. ...................... 29/76 |
| 2002/0164420 A1 | 11/2002 | Derderian et al. ....... 427/248.1 |
| 2002/0192974 A1 | 12/2002 | Ahn et al. ................... 438/722 |
| 2003/0003722 A1 | 1/2003 | Vaartstra ..................... 438/656 |
| 2003/0017717 A1 | 1/2003 | Ahn et al. ................... 438/768 |
| 2003/0045082 A1 | 3/2003 | Eldridge et al. |
| 2003/0072882 A1 | 4/2003 | Niinisto et al. |
| 2003/0119291 A1 | 6/2003 | Ahn et al. |
| 2003/0157764 A1 | 8/2003 | Ahn et al. ................... 438/212 |
| 2003/0207032 A1 | 11/2003 | Ahn et al. ............. 427/255.34 |
| 2003/0207593 A1 | 11/2003 | Derderian ................... 438/778 |
| 2003/0209324 A1 | 11/2003 | Fink ...................... 156/345.48 |
| 2003/0227033 A1 | 12/2003 | Ahn et al. ................... 257/213 |
| 2003/0228747 A1 | 12/2003 | Ahn et al. ................... 438/591 |
| 2004/0004245 A1 | 1/2004 | Forbes et al. ............... 237/315 |
| 2004/0004247 A1 | 1/2004 | Forbes et al. ............... 257/324 |
| 2004/0033681 A1 | 2/2004 | Ahn et al. ................... 438/591 |
| 2004/0033701 A1 | 2/2004 | Ahn et al. ................... 438/785 |
| 2004/0038525 A1 | 2/2004 | Meng et al. ................. 438/656 |
| 2005/0138262 A1 | 6/2005 | Forbes |
| 2005/0277256 A1 | 12/2005 | Ahn et al. |
| 2005/0280067 A1 | 12/2005 | Ahn et al. |

OTHER PUBLICATIONS

Clark–Phelps, R. B., et al., "Engineered Tantalum Aluminate and Hafnium Aluminate ALD Films for Ultrathin Dielectric Films with Improved Electric and Thermal Properties", *Gate Stack and Silicide Issues in Silicon Processing II, Symposium* (Materials Research Society Symposium Proceedings vol. 670), (Apr. 17, 2001),K2.2.1–6.

Lee, Jung–Hyoung , et al., "Mass production worthy HfO/sub 2/–Al/sub 2/O/sub 3/ laminate capacitor technology using Hf liquid precursor for sub–100 nm DRAMs", *Electron Devices Meeting, 2002. IEDM '02. Digest. International*, (2002),221–224.

Oh, C B., et al., "Manufacturable embedded CMOS 6T–SRAM technology with high–k gate dielectric device for system–on–chip applications", *Technical Digest of International Electron Devices Meeting 2002*, (2002),423–426.

Ahn, Seong–Deok , et al., "Surface Morphology Improvement of Metalorganic Chemical Vapor Deposition Al Films by Layered Deposition of Al and Ultrathin TiN", *Jpn. J. Appl. Phys. vol. 39 (2000) 3349–3354*, (Jun. 2000),3349–3354.

Alen, Petra , et al., "Atomic Layer Deposition of Ta(Al)N(C) Thin Films Using Trimethylaluminum as a Reducing Agent", *Journal of Electrochemical Society, 148 (10), pp. G566–G571 (2001). From disclosure of 1303.068US1,* (2001),pp. G566–G571.

Elam, J W., "Kinetics of the WF6 and Si2H6 surface reactions during tungsten atomic layer deposition", *Surface Science*, vol. 479,(2001),pp. 121–135.

Gusev, E P., et al., "Ultrathin High–K Dielectrics Grown by Atomic Layer Deposition: A Comparative Study of ZrO2, HfO2, Y2O3 and Al2O3", *Electrochemical Society Proceedings vol. 2001–9*, (2001),pp. 189–195.

Aarik, Jaan.,et al. ,"Texture development in nanocrystalline hafnium dioxide thin films grown by atomic layer deposition", *Journal of Crystal Growth*, (2000), pp. 105–113.

Cheng, Baohong.,et al. ,"The Impact of High-k Gate Dielectrics and Metal Gate Electrodes on Sub–100nm MOSFET's", *IEEE Transactions on Electron Devices*, (1999), pp. 1537–1544.

Desu, S.B..,"Minimization of Fatigue in Ferroelectric Films", *Phys. Stat. Sol. (a) 151*, (1995), pp. 467–480.

Engelhardt, M..,"Modern Applications of Plasma Etching and Patterning in Silicon Process Technology", *Contrib. Plasma. Phys., 39(5)*, (1999), pp. 473–478.

Fuyuki, Takashi., et al., "Electronic Properties of the Interface between Si and TiO2 Deposited at Very Low Temperatures", *Journal of Applied Physics*, (1986), pp. 1288–1291.

Gartner, M., et al., "Spectroellipsometric characterization of lanthanide–doped TiO2 films obtained via the sol–gel technique", *Thin Solid Films*, (1993), pp. 561–565.

Geller, S., et al., "Crystallographic Studies of Perovskite–like Compounds. II. Rare Earth Aluminates", *Acta Cryst. vol. 9*, (May 29, 1956), pp. 1019–1025.

Giess, E..A., et al., "Lanthanide gallate perovskite–type substrates for epitaxial, high–Tc superconducting Ba2YCu3O7– films", *IBM J. Res. Develop. vol. 34, No. 6*, (Nov. 6, 1990), pp. 916–926.

Hirayama, Masaki., et al., "Low–Temperature Growth of High–Integrity Silicon Oxide Films by Oxygen Radical Generated in High Density Krypton Plasma", *IEDM Technical Digest*, (1999), pp. 249–252.

Hubbard, K..J., et al., "Thermodynamic stability of binary oxides in contact with silicon", *J. Mater. Res.*, (Nov. 1996), pp. 2757–2776.

Hunt, C..E., et al., "Direct bonding of micromachined silicon wafers for laser diode heat exchanger applications", *J. Micromech. Microeng., 1*, (1991), pp. 152–156.

Jeong, Chang–Wook., et al., "Plasma–Assisted Atomic Layer Growth of High–Quality Aluminum Oxide Thin Films", *Japanese Journal of Applied Physics*, (Jan. 2001), pp. 285–289.

Keomany, D., et al., "Sol gel preparation of mixedcerium–titanium oxide thin films", *Solar Energy Materials and Solar Cells*, (1994), pp. 429–441.

Kim, C.T., et al., "Application of Al2O3 Grown by Atomic Layer Deposition to DRAM and FeRAM", *International Symposium in Integrated Ferroelectrics*, (Mar. 2000), pp. 316.

Kim, Y., et al., "Substrate dependence on the optical properties of Al2O3 films grown by atomic layer deposition", *Applied Physics Letters*, (Dec. 1997), pp. 3604–3606.

Krauter, G., et al., "Room Temperature Silicon Wafer Bonding with Ultra–Thin Polymer Films", *Advanced Materials, 9(5)*, (1997), pp. 417–420.

Kukli, Kaupo., et al., "Atomic Layer Deposition of Titanium Oxide from TiI4 and H2O2", *Chemical Vapor Deposition*, (2000), pp. 303–310.

Kukli, K., et al., "Controlled Growth of Yttrium Oxysulphide Thin Films by Atomic Layer Deposition", *Materials Science Forum*, (1999), pp. 216–221.

Lee, A..E., et al., "Epitaxially grown sputtered LaAlO3 films", *Appl. Phys. Lett. 57(19)*, (Nov. 5, 1990), pp. 2019–2021.

Lee, Cheng–Chung., et al., "Ion–assisted deposition of silver thin films", *Thin Solid Films*, (2000), pp. 95–97.

Lee, Dong.H., et al., "Metalorganic chemical vapor deposition of Tio2:n anatase thin film on Si substrate", *Applied Physics Letters*, (Feb. 1995), pp. 815–816.

Lee, L..P., et al., "Monolithic 77 K dc SQUID mangetometer", *Appl. Phys. Lett. 59(23)*, (Dec. 2, 1991), pp. 3051–3053.

Leskela, M., et al., "ALD precursor chemistry: Evolution and future challenges", *Journal de Physique*, (1999), pp. 837–852.

Liu, C..T., "Circuit Requirement and Integration Challenges of Thin Gate Dielectrics for Ultra Small MOSFET's", *IEDM*, (1998), pp. 747–750.

Lucovsky, G., et al., "Microscopic model for enhanced dielectric constants in low concentration SiO2–rich noncrystalline Zr and Hf silicate alloys", *Applied Physics Letters*, (Oct. 2000), pp. 2912–2914.

Molodyk, A..A., et al., "Volatile Surfactant–Assisted MOCVD: Application to LaA103 Thin Film Growth", *Chem. Vap. Deposition vol. 6, No. 3*, (2000,), pp. 133–138.

Molsa, Heini., et al., "Growth of Yttrium Oxide Thin Films from B–Diketonate Precursor", *Advanced Materials for Optics and Electronics*, (1994), pp. 389–400.

Muller, D..A., et al., "The electronic structure at the atomic scale of ultrathin gate oxides", *Nature, vol. 399, No. 6738, Jun. 24, 1999*, (1999), pp. 758–761.

Nakajima, Anri., et al., "NH3–annealed atomic–layer–deposited silicon nitride as a high–k gate dielectric with high reliability", *Applied Physics Letters*, (Feb. 2002), pp. 1252–1254.

Neumayer, D.A., et al., "Materials characterization of ZrO2–SiO2 and HfO2–SiO2 binary oxides deposited by chemical solution deposition", *Journal of Applied Physics*, (Aug. 2001), pp. 1801–1808.

Nieminen, Minna., et al., "Formation and stability of lanthanum oxide thin films deposited from B–diketonate precursor", *Applied Surface Science*, (2001), pp. 155–165.

Ohring, Milton., "The Materials Science of Thin Films", *Academic Press INC.*, (1992), pp. 118,121,125.

Osten, H..J., et al., "High–k Gate Dielectrics with Ultra–low Leakage Current Based on Praseodymium Oxide", *IEEE*, (2000), pp. 653–656.

Park, Byung–Eun., et al., "Electrical properties of LaAlO3/Si and Sr0.8Bi2.2Ta2O9/LaAlO3/Si structures", *Applied Physics Letters*, vol. 79, No. 6,(Aug. 6, 2001), pp. 806–808.

Qi, Wen–Jie., et al., "MOSCAP and MOSFET characteristics using ZrO2 gate dielectric deposited directly on Si", *IEDM Technical Digest*, (1999), pp. 145–148.

Rayner Jr., G., et al., "The Structure of Plasma–Deposited and Annealed Pseudo–Binary ZrO2–SiO2 Alloys", *Material Res. Soc. Symp.*, (2000), pp. C1.3.1–C1.3.9.

Ritala, Mikko., "Atomic Layer Epitaxy Growth of Titanium, Zirconium and Hafnium Dioxide Thin Films", *Annales Academiae Scientiarum Fennicae*, (1994), pp. 24–25.

Rotondaro, A.L., et al., "Advanced CMOS Transistors with a Novel HfSiON Gate Dielectric", *Symposium on VLSI Technology Digest of Technical Papers*, (2002), pp. 148–149.

Saito, Yuji., et al., "Advantage of Radical Oxidation for Improving Reliability of Ultra–Thin Gate Oxide", *2000 Symposium on VLSI Technology Digest of Technical Papers*, (2000), pp. 176–177.

Saito, Yuji., et al., "High–Integrity Silicon Oxide Grown at Low–Temperature by Atomic Oxygen Generated in High–Density Krypton Plasma", *Extended Abstracts of the 1999 International Conference on Solid State Devices and Materials*, (1999), pp. 152–153.

Shanware, A., et al., "Reliability evaluation of HfSiON gate dielectric film with 12.8 A SiO2 equivalent thickness", *International Electron Devices Meeting*, (2001), pp. 137–140.

Shin, Chang.H., et al., "Fabrication and Characterization of MFISFET using Al2O3 Insulating Layer for Non–Volatile Memory", *12th International Symposium in Integrated Ferroelectrics*, (Mar. 2000), pp. 1–9.

Sneh, Ofer., et al., "Thin film atomic layer deposition equipment for semiconductor processing", *Thin Solid Films*, (2002), pp. 248–261.

Song, Hyun–Jung., et al., "Atomic Layer Deposition of Ta2O5 Films Using Ta(OC2H5)5 and NH3", *Mat. Res. Soc. Symp. Proc.*, (1999), pp. 469–471.

Suntola, T.., "Atomic Layer Epitaxy", *Handbook of Crystal Growth, 3; Thin Films of Epitaxy, Part B: Growth Mechanics and Dynamics*, Amsterdam, (1994), pp. 601–663.

Suntola, T.., "Atomic layer epitaxy", *Thin Solid Films, 216*, (1992), pp. 84–89.

Takemoto, J..H., et al., "Microstrip Resonators and Filters Using High–TC Superconducting Thin Films on LaAlO3", *IEEE Transaction on Magnetics, vol. 27, No. 2*, (Mar., 1991), pp. 2549–2552.

Van Dover, R.B., "Amorphous lanthanide–doped TiOx dielectric films", *Applied Physics Letters*, (May 1999), pp. 3041–3043.

Viirola, H., et al., "Controlled growth of antimony–doped tin dioxide thin films by atomic layer epitaxy", *Thin Solid Films*, (1994), pp. 127–135.

Viirola, H., et al., "Controlled growth of tin oxide thin films by atomic layer epitaxy", *Thin Solid Films*, (1994), pp. 144–149.

Visokay, M.R., et al., "Application of HfSiON as a gate dielectric material", *Applied Physics Letters*, (Apr. 2002), pp. 3183–3185.

Wilk, G.D., et al., "Hafnium and zirconium silicates for advanced gate dielectrics", *Journal of Applied Physics*, (Jan. 2000), pp. 484–492.

Wilk, G..D., et al., "High–K gate dielectrics: Current status and materials properties considerations", *J. Appl. Phys., vol. 89, No. 10*, (May 15, 2001), pp. 5243–5275.

Zucker, O.., et al., "Application of Oxygen Plasma Processing to Silicon Direct Bonding", *Sensors and Actuators A, 36*, (1993), pp. 227–231.

ATOMIC LAYER-DEPOSITED LAALO₃ FILMS FOR GATE DIELECTRICS

RELATED APPLICATIONS

This application is related to the following, co-pending, commonly assigned applications, incorporated herein by reference:

U.S. application Ser. No. 10/081,439, entitled: "Evaporated LaAlO₃ Films for Gate Dielectrics,"

U.S. application Ser. No. 10/137,058, entitled: "Atomic Layer Deposition and Conversion,"

U.S. application Ser. No. 10/137,168, entitled: "Atomic Layer of AlO$_x$ for ULSI Gate Atomic Layer Deposition for Gate Dielectric Layer," and U.S. application Ser. No. 09/797,324, entitled: "Methods, Systems, and Apparatus for Uniform Chemical-Vapor Depositions."

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, where the body region 132 defines a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon), or other conducting materials such as metal may be used.

In fabricating transistors to be smaller in size and reliably operating on lower power supplies, one important design criteria is the gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but with increased scaling, other requirements for gate dielectrics create the need to find other dielectric materials to be used for a gate dielectric.

What is needed is an alternate dielectric material for forming a gate dielectric that has a high dielectric constant relative to $SiO_2$, and is thermodynamically stable with respect to silicon such that forming the dielectric on a silicon layer will not result in $SiO_2$ formation, or diffusion of material, such as dopants, into the gate dielectric from the underlying silicon layer.

SUMMARY OF THE INVENTION

A solution to the problems as discussed above is addressed in the present invention. In accordance with the present invention, a method of forming a gate dielectric on a transistor body region includes the atomic layer deposition of an amorphous film containing LaAlO₃ on the transistor body region. The ALD formation of the LaAlO₃ film is performed by pulsing a lanthanum containing precursor into a reaction chamber containing a substrate, pulsing a first oxygen containing precursor into the reaction chamber, pulsing an aluminum containing precursor into the reaction chamber, and pulsing a second oxygen containing precursor into the reaction chamber. Each precursor is pulsed into the reaction chamber for a selected time period. A length of time for pulsing each precursor is selected according to the precursor used. Between each precursor pulsing, precursor excess and reaction by-products are removed from the reaction. The LaAlO₃ film thickness is controlled by repeating for a number of cycles the pulsing of the lanthanum containing precursor, the first oxygen containing precursor, the aluminum containing precursor, and the second oxygen containing precursor until the desired thickness is formed.

A transistor is fabricated on a substrate by forming two source/drain regions separated by a body region, pulsing a La(thd)₃ (thd=2,2,6,6-tetramethyl-3,5-heptanedione) source gas into a reaction chamber containing the substrate, pulsing ozone into the reaction chamber, pulsing a trimethylaluminum, $Al(CH_3)_3$, source gas into the reaction chamber, and pulsing water vapor into the reaction chamber. Controlling the processing temperatures, and the number of cycles of the lanthanum precursor and the number of cycles of the aluminum precursor provides the capability to form a film composition having a predetermined dielectric constant. A DMEAA, an adduct of alane ($AlH_3$) and dimethylethylamine [$N(CH_3)_2(C_2H_5)$], source gas can be used in place of the trimethylaluminum source gas.

Advantageously, these methods can be used to further form a memory array where the process of forming the memory array is adapted to form gate dielectrics in accordance with the present invention. Additionally, an information handling system can be formed using the methods of the present invention, wherein a memory array fabricated in conjunction with fabricating a processor is formed to include transistors having gate dielectrics containing LaAlO₃. These gate dielectrics are formed by the ALD processing of a lanthanum sequence and a aluminum sequence for a number of cycles to provide a film containing $LaAlO_3$.

In accordance with the present invention, a transistor having two source/drain regions separated by a body region includes an amorphous gate dielectric containing $LaAlO_3$ located above the body region between the two source/drain regions. The gate dielectric may be essentially composed of $LaAlO_3$ or it may also contain $Al_2O_3$, and $La_2O_3$. Depending on its composition, the dielectric constant of the gate dielectric can range from about 9 to about 30. Depending on its composition, the gate dielectric can have a thickness corresponding to an equivalent oxide thickness ($t_{eq}$) in the range from about 1.5 Angstroms to about 5 Angstroms, in addition to larger $t_{eq}$ values.

Advantageously, a memory array includes a number of transistors having two source/drain regions separated by a body region with an amorphous gate dielectric containing $LaAlO_3$ located above the body region between the two source/drain regions. These transistors provide the memory array with an array of transistors having gate dielectrics with equivalent oxide thickness ($t_{eq}$) in the range from about 1.5 Angstroms to about 5 Angstroms, providing transistors operable at reduced voltage levels. Additionally, an information handling device, such as a computer, includes a processor and a memory array having a number of transistors with two source/drain regions separated by a body region that includes an amorphous gate dielectric containing $LaAlO_3$ located above the body region between the two source/drain regions.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
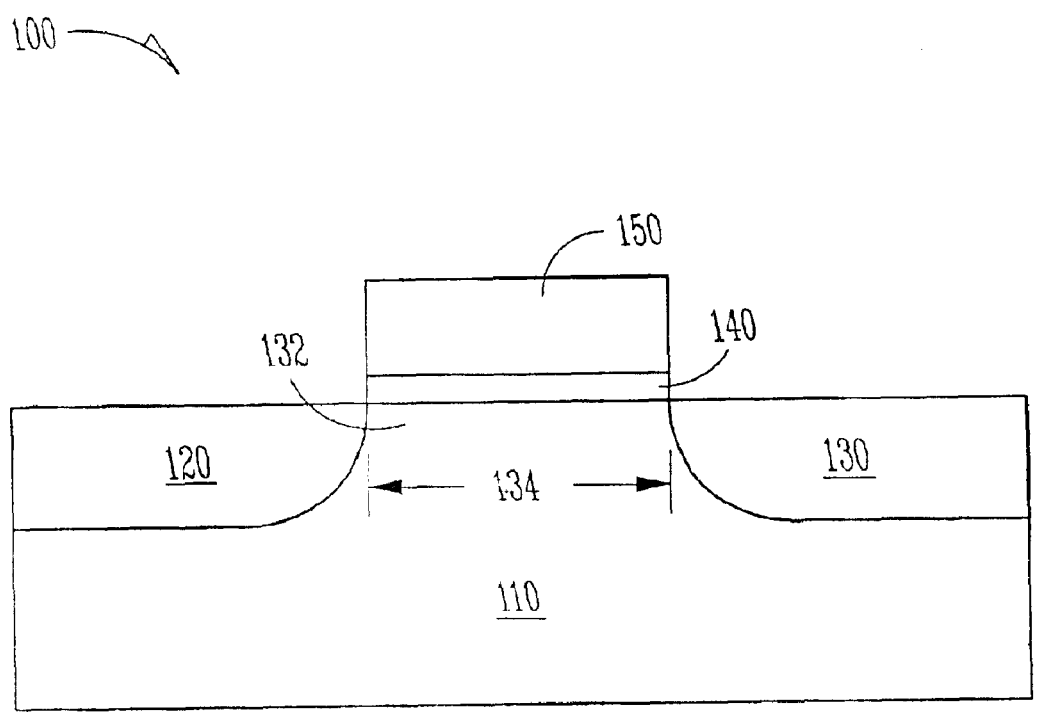
FIG. 1 depicts a common configuration of a transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will also have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness, $t_{eq}$, to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in complementary metal-oxide-semiconductor field effect transistor (CMOS) technology. Thus, future devices would be designed towards a physical SiO$_2$ gate dielectric layer of about 5 Å or less. Such a small thickness requirement for a SiO$_2$ oxide layer creates additional problems.

Silicon dioxide is used as a gate dielectric, in part, due to its electrical isolation properties in a SiO$_2$—Si based structure. This electrical isolation is due to the relatively large band gap of SiO$_2$ (8.9 eV) making it a good insulator from electrical conduction. Signification reductions in its band gap would eliminate it as a material for a gate dielectric. As the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as in a larger or bulk layer. As a result of incomplete formation relative to a bulk structure, a thin SiO$_2$ layer of only one or two monolayers will not form a full band gap. The lack of a full band gap in a SiO$_2$ gate dielectric would cause an effective short between an underlying Si channel and an overlying polysilicon gate. This undesirable property sets a limit on the physical thickness to which a SiO$_2$ layer can be scaled. The minimum thickness due to this monolayer effect is thought to be about 7–8 Å. Therefore, for future devices to have a $t_{eq}$ less than about 10 Å, other dielectrics than SiO$_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of SiO$_2$, $\kappa_{ox}=3.9$, associated with $t_{eq}$, as $$t=(\kappa/\kappa_{ox})t_{eq}=(\kappa/3.9)t_{eq}.$$

Thus, materials with a dielectric constant greater than that of SiO$_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than SiO$_2$.

The thinner equivalent oxide thickness, $t_{eq}$, required for lower transistor operating voltages and smaller transistor dimensions may be realized by a significant number of materials, but additional fabricating requirements makes determining a suitable replacement for SiO$_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of SiO$_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the SiO$_2$ thickness and a multiplicative factor of the thickness of the dielectric being formed. Thus, if a SiO$_2$ layer is formed in the process, the $t_{eq}$ is again limited by a SiO$_2$ layer. In the event, that a barrier layer is formed between the silicon layer and the desired dielectric in which the barrier layer prevents the formation of a SiO$_2$ layer, the $t_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer must provide a high quality interface to maintain a high channel carrier mobility.

In a recent article by G. D. Wilk et al., *Journal of Applied Physics*, vol. 89: no. 10, pp. 5243–5275 (2001), material properties of high dielectric materials for gate dielectrics were discussed. Among the information disclosed was the viability of Al$_2$O$_3$ as a substitute for SiO$_2$. Al$_2$O$_3$ was disclosed as having favourable properties for use as a gate dielectric such as high band gap, thermodynamic stability on Si up to high temperatures, and an amorphous structure. In addition, Wilk disclosed that forming a layer of Al$_2$O$_3$ on silicon does not result in a SiO$_2$ interfacial layer. However, the dielectric constant of Al$_2$O$_3$ is only 9, where thin layers may have a dielectric constant of about 8 to about 10. Though the dielectric constant of Al$_2$O$_3$ is in an improvement over SiO$_2$, a higher dielectric constant for a gate dielectric is desirable. Other dielectrics and their properties discussed by Wilk include

| Material | Dielectric Constant ($\kappa$) | Band gap $E_g$ (eV) | Crystal Structure(s) |
|---|---|---|---|
| SiO$_2$ | 3.9 | 8.9 | Amorphous |
| Si$_3$N$_4$ | 7 | 5.1 | Amorphous |
| Al$_2$O$_3$ | 9 | 8.7 | Amorphous |
| Y$_2$O$_3$ | 15 | 5.6 | Cubic |
| La$_2$O$_3$ | 30 | 4.3 | Hexagonal, Cubic |
| Ta$_2$O$_3$ | 26 | 4.5 | Orthorhombic |
| TiO$_2$ | 80 | 3.5 | Tetrag. (rutile, anatase) |
| HfO$_2$ | 25 | 5.7 | Mono., Tetrag., Cubic |
| ZrO$_2$ | 25 | 7.8 | Mono., Tetrag., Cubic |

One of the advantages using SiO$_2$ as a gate dielectric has been that the formation of the SiO$_2$ layer results is an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. The abovementioned material properties including structure are for the materials in a bulk form. The materials having the advantage of a high dielectric constants relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form.

In co-pending, commonly assigned U.S. patent applications: entitled "Evaporated LaAlO$_3$ Films for Gate Dielectrics," Ser. No. 10/08 1,439, LaAlO$_3$ is disclosed as a replacement for SiO$_2$ as material for forming gate dielectrics and other dielectric films in electronic devices such as MOS transistors. This application disclosed, among other things, forming layers of LaAlO$_3$ on silicon by electron beam evaporation of dry pellets of Al$_2$O$_3$ and La$_2$O$_3$ using two electron guns controlled by two rate monitors. Controlling the rates for evaporating the dry pellets of Al$_2$O$_3$ and La$_2$O$_3$ allows for the formation of a gate dielectric having a composition with a predetermined dielectric constant. The predetermined dielectric constant will range from the dielectric constant of Al$_2$O$_3$ to the dielectric constant of La$_2$O$_3$, depending on the composition of the film. Films substantially consisting of LaAlO$_3$ film could be obtained on silicon providing an amorphous dielectric layer with a dielectric constant between 21 and 24. Other reports indicate that $LaAlO_3$ film can be grown by metal-organic chemical-vapor-deposition method, volatile surfactant-assited metal-organic chemical-vapor-deposition method, pulsed-laser depositions method, and rf magnetron sputtering method.

In accordance with the present invention, layers of $LaAlO_3$ can be deposited on silicon using atomic layer deposition (ALD), also known as atomic layer epitaxy (ALE). ALD was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with an inert gas or evacuated. In the first pulsing phase, reaction with the substrate occurs with the precursor saturatively chemisorbed at the substrate surface. Subsequent purging removes precursor excess from the reaction chamber. The second pulsing phase introduces another precursor on the substrate where the growth reaction of the desired film takes place. Subsequent to the film growth reaction, reaction byproducts and precursor excess are purged from the reaction chamber. For favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

Advantageously, in ALD, the saturation of all the reaction and purging phases or steps makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward, simple manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several requirements for precursors used in ALD. The precursors must be thermally stable at the substrate temperature because their decomposition would destroy the surface control and accordingly the advantages of the ALD method which relies on the reactant of the precursor at the substrate surface. Of course, a slight decomposition, if slow compared to the ALD growth, can be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In accordance with the present invention, a $LaAlO_3$ film is formed on a substrate mounted in a reaction chamber by pulsing a lanthanum containing precursor into the reaction chamber followed by pulsing a first oxygen containing precursor, and by pulsing an aluminum containing precursor into the reaction chamber followed by pulsing a second oxygen containing precursor into the reaction chamber. Between each pulsing, a purging gas is introduced into the reaction chamber. Pulsing a lanthanum containing precursor into the reaction chamber followed by pulsing a first oxygen containing precursor with subsequent purging after each pulsing constitutes a lanthanum sequence. Similarly, pulsing an aluminum containing precursor into the reaction chamber followed by pulsing a second oxygen containing precursor into the reaction chamber with subsequent purging after each pulsing constitutes an aluminum sequence. The selection of the first oxygen containing precursor depends upon the lanthanum containing precursor pulsed into the chamber, and likewise, the second oxygen containing precursor depends upon the aluminum precursor pulsed into the chamber. Additionally, different purging gases can be employed for the lanthanum sequence and the aluminum sequence. Furthermore, pulsing each precursor into the reaction chamber is individually controlled for a predetermined period, where the predetermined period for each precursor differs according to the nature of the precursor.

The precursors are selected such that performing one lanthanum sequence followed by an aluminum sequence completes one cycle of ALD deposition of a $LaAlO_3$ layer. The thickness of this $LaAlO_3$ layer will depend on the precursors used, the period of the pluses, and the processing temperature. A $LaAlO_3$ film with a predetermined thickness is formed by repeating for a number of cycles the lanthanum sequence and the aluminum sequence. Once a $LaAlO_3$ film with the desired thickness is formed, the $LaAlO_3$ film is annealed.

In an embodiment of the present invention, precursor gases are used to form $LaAlO_3$ films as a gate dielectric on a transistor body. Alternately, solid or liquid precursors can be used in an appropriately designed reaction chamber. ALD formation of other materials is disclosed in co-pending, commonly assigned U.S. patent applications: entitled "Atomic Layer Deposition and Conversion," Ser. No. 10/137,058, and "Atomic Layer of $AlO_x$ for ULSI Gate Atomic Layer Deposition for Gate Dielectric Layer," Ser. No. 10/137,168.

Figure 2A:
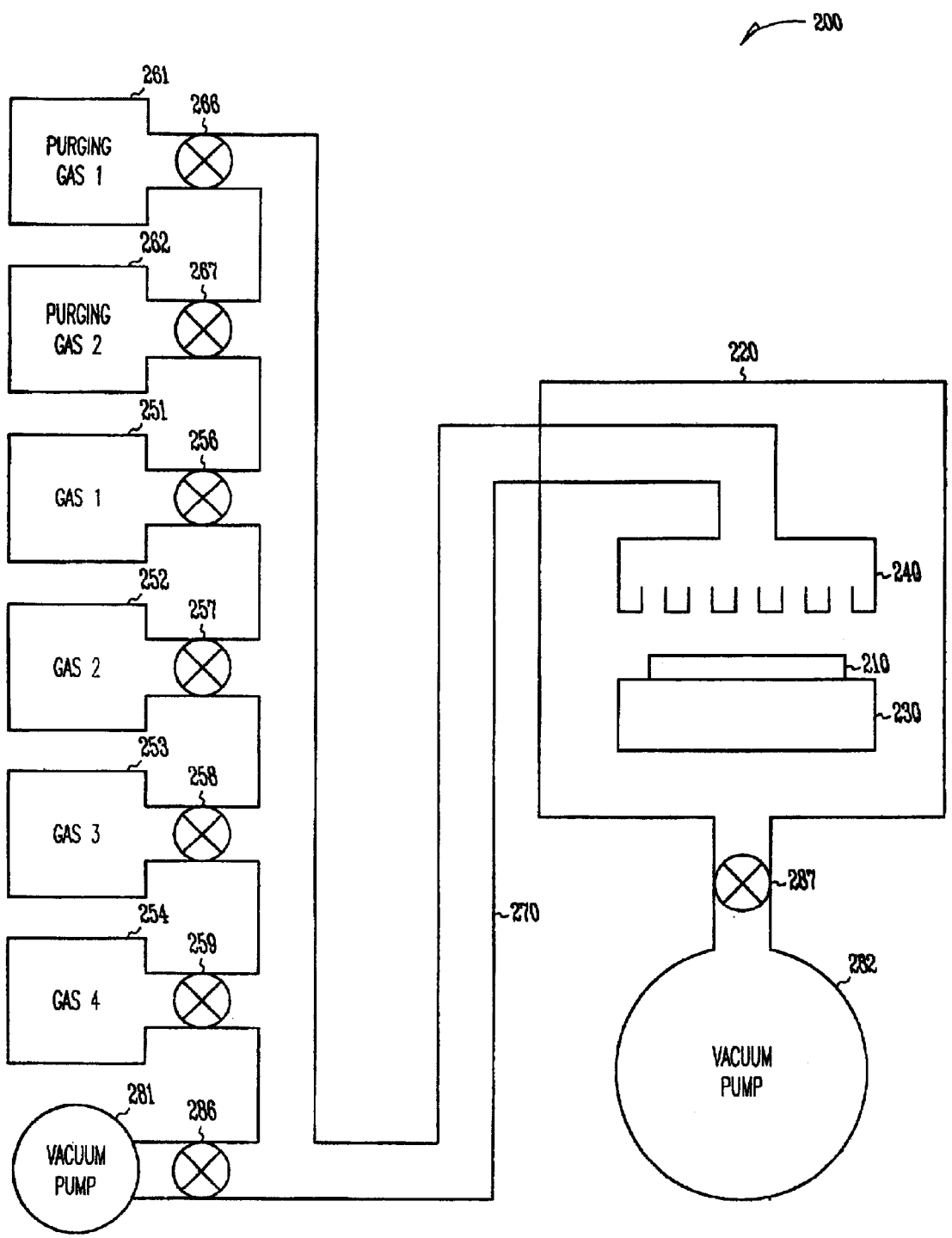
FIG. 2A depicts an atomic layer deposition system for processing a $LaAlO_3$ film in accordance with the present invention.

FIG. 2A depicts elements of an atomic layer deposition system for processing a $LaAlO_3$ film in accordance with the present invention. The elements depicted are those elements necessary for discussion of the present invention such that those skilled in the art may practice the present invention without undue experimentation. A further discussion of the ALD reaction chamber can be found in co-pending, commonly assigned U.S. patent applications: entitled "Methods, Systems, and Apparatus for Uniform Chemical-Vapor Depositions," Ser. No. 09/797,324, incorporated herein by reference. In FIG. 2A, a substrate 210 is placed inside a reaction chamber 220 of ALD system 200. Also located within the reaction chamber 220 is a heating element 230 which is thermally coupled to substrate 210 to control the substrate temperature. A gas-distribution fixture 240 introduces precursor gases to the substrate 210. Each precursor gas originates from individual gas sources 251, 252, 253, 254 whose flow is controlled by mass-flow controllers 256, 257, 258, 259, respectively. The gas sources 251–254 provide a precursor gas either by storing the precursor as a gas or by providing a location and apparatus for evaporating a solid or liquid material to form the selected precursor gas.

Also included in the ALD system are purging gas sources 261, 262, each of which is coupled to mass-flow controllers 266, 267, respectively. The gas sources 251–254 and the purging gas sources 261–262 are coupled by their associated mass-flow controllers to a common gas line or conduit 270 which is coupled to the gas-distribution fixture 240 inside the reaction chamber 220. Gas conduit 270 is also coupled to vacuum pump, or exhaust pump, 281 by mass-flow controller 286 to remove excess precursor gases, purging gases, and by-product gases at the end of a purging sequence from the gas conduit.

Vacuum pump, or exhaust pump, 282 is coupled by mass-flow controller 287 to remove excess precursor gases, purging gases, and by-product gases at the end of a purging sequence from the reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
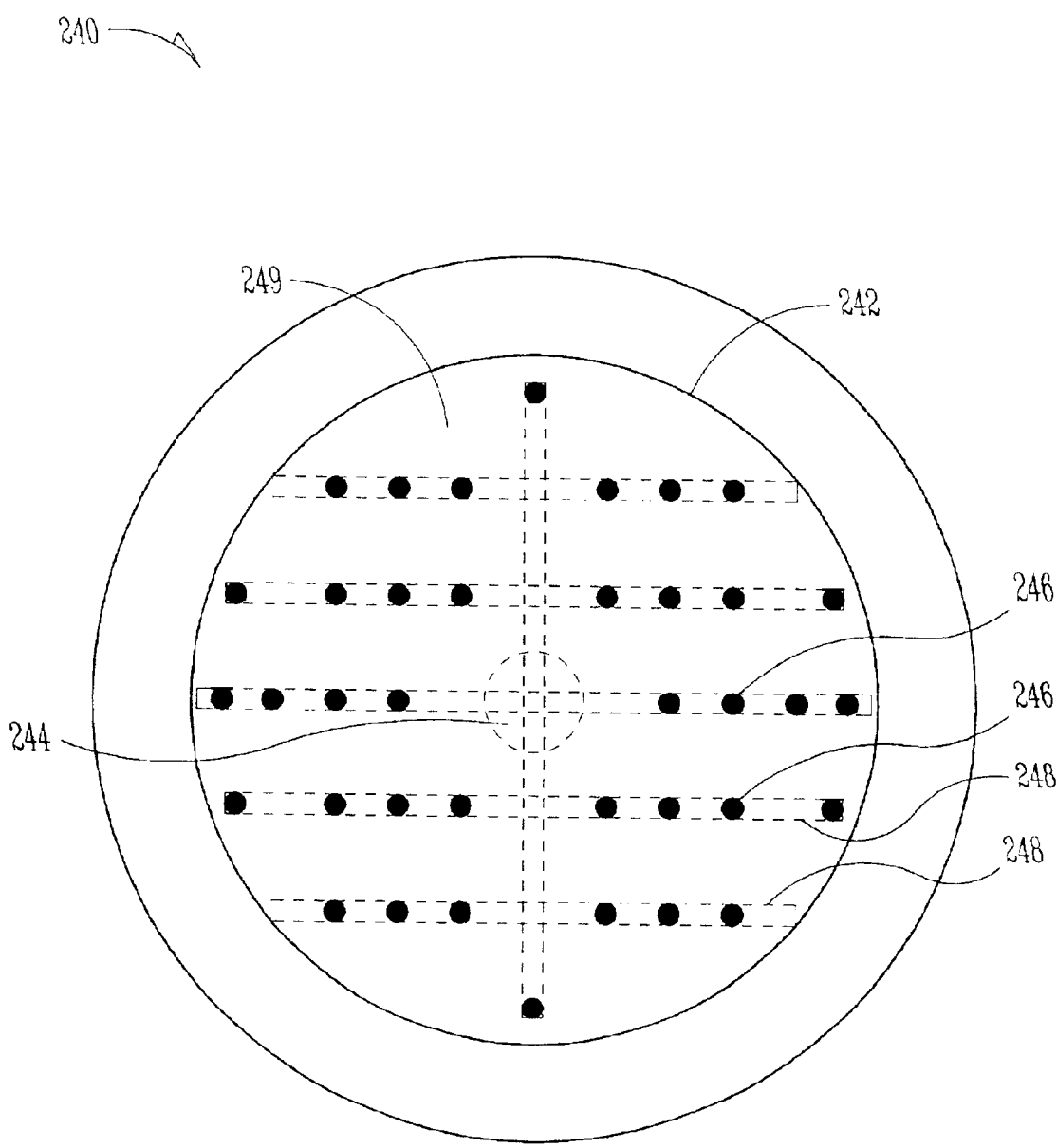
FIG. 2B depicts a gas-distribution fixture of an atomic layer deposition chamber for processing a $LaAlO_3$ film in accordance with the present invention.

FIG. 2B depicts a gas-distribution fixture of an atomic layer deposition chamber for processing a $LaAlO_3$ film. Gas-distribution fixture 240 includes a gas-distribution member 242, and a gas inlet 244. Gas inlet 244 couples the gas-distribution member 242 to the gas conduit 270 of FIG. 2A. Gas-distribution member 242 includes gas-distribution holes, or orifices, 246 and gas-distribution channels 248. In the exemplary embodiment, holes 246 are substantially circular with a common diameter in the range of 15–20 microns; gas-distribution channels 248 have a common width in the range of 20–45 microns. The surface 249 of the gas distribution member having gas-distribution holes 246 is substantially planar and parallel to the substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though the ALD system 200 is well suited for practicing the present invention, other ALD systems commercially available can be used.

The use, construction and fundamental operation of reaction chambers for deposition of films are understood by those of ordinary skill in the art of semiconductor fabrication. The present invention man be practiced on a variety of such reaction chambers without undue experimentation. Furthermore, one of ordinary skill in the art will comprehend the necessary detection, measurement, and control techniques in the art of semiconductor fabrication upon reading the disclosure.

Figure 3:
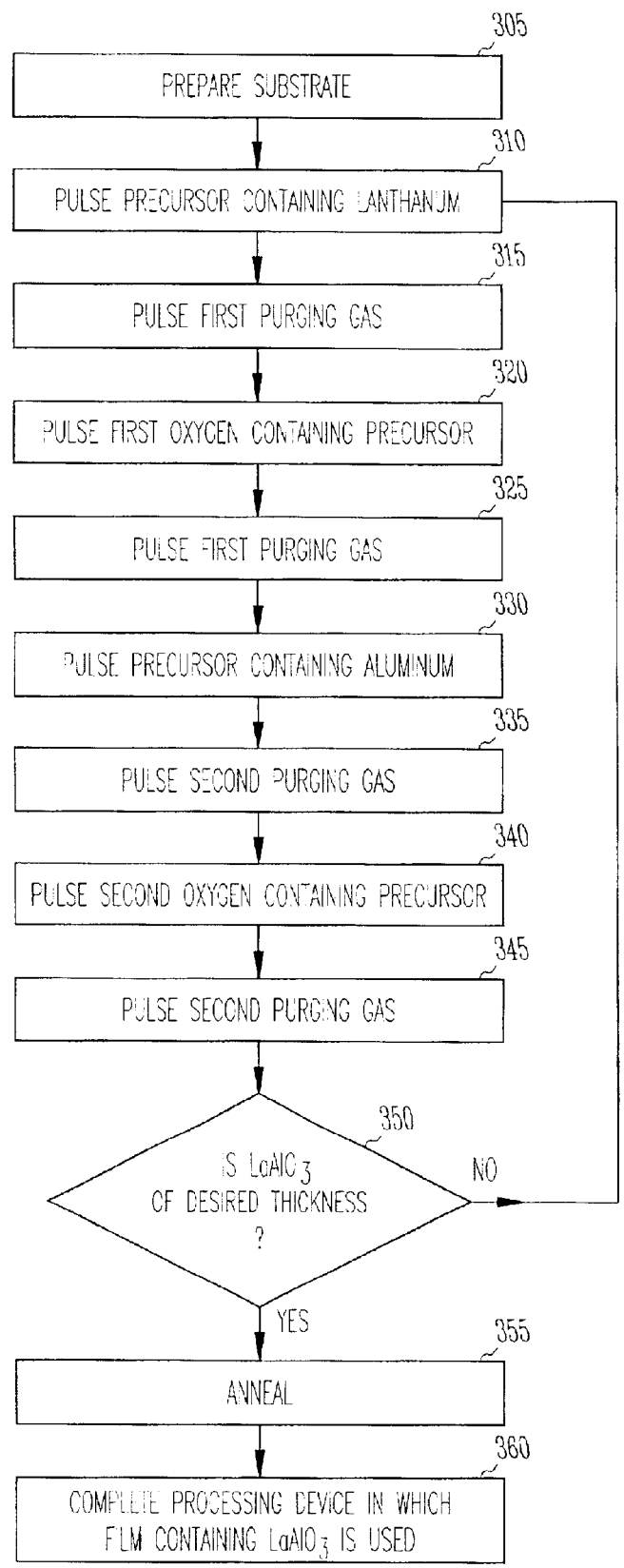
FIG. 3 depicts a flow diagram of elements of a method to process a $LaAlO_3$ film in accordance with the present invention.

FIG. 3 depicts a flow diagram of elements of a method to process a $LaAlO_3$ film. The method can be implemented with the atomic layer deposition system of FIGS. 2A,B. At 305, a substrate is prepared. The substrate used for forming a transistor is typically a silicon or silicon containing material. This preparation process includes cleaning of the substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 220 for ALD processing.

At 310, a precursor containing lanthanum is pulsed into reaction chamber 220. In particular, $La(thd)_3$ (thd=2,2,6,6-tetramethyl-3,5-heptanedione) is used as a source material. The $La(thd)_3$ is pulsed into reaction chamber 220 through the gas-distribution fixture 240 onto substrate 210. The flow of the $La(thd)_3$ is controlled by mass-flow controller 256 from gas source 251. The $La(thd)_3$ gas can be formed from evaporation from an open crucible held at about 170° C. and provided to the gas source 251. The $La(thd)_3$ reacts with the surface of the substrate 210 in the desired region defined by the unmasked areas of the substrate 210.

At 315, a first purging gas is pulsed into the reaction chamber 220. In particular, nitrogen with a purity greater than 99.99% is used as a purging gas and a carrier gas for $La(thd)_3$. The nitrogen flow is controlled by mass-flow controller 266 from the purging gas source 261 into the gas conduit 270. Following the purge, at 320, a first oxygen containing precursor is pulsed into the reaction chamber 220. For the lanthanum sequence using $La(thd)_3$ as the precursor, ozone gas is selected as the precursor acting as an oxidizing reactant to form a lanthanum oxide on the substrate 210. The ozone gas is pulsed into the reaction chamber 220 through gas conduit 270 from gas source 252 by mass-flow controller 257. The ozone aggressively reacts at the surface of substrate 210.

Following the pulsing of oxidizing reactant ozone, at 325, the first purging gas is injected into the reaction chamber 220. In the $La(thd)_3$/ozone sequence, nitrogen gas is used to purge the reaction chamber after pulsing each precursor gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

During the $La(thd)_3$/ozone sequence, the substrate is held between about 180° C. and about 425° C. by the heating element 230 with the reaction chamber having a reduced pressure near the substrate of 2–3 mbar (1.5–2.25 Torr). The $La(thd)_3$ pulse time ranges from about 0.5 sec to about 1.5 sec. One embodiment uses a $La(thd)_3$ pulse time of 0.8 sec, while another embodiment uses a $La(thd)_3$ pulse time of 1.0 sec. The purge pulses range from about 0.8 sec to about 3 sec. The ozone pulse times range from about 1 sec to about 3 sec, with one embodiment employing a 2 sec ozone pulse time.

At 330, a precursor containing aluminum is pulsed into the reaction chamber 220. In one embodiment of the present invention, trimethylaluminum (TMA), $Al(CH_3)_3$, is used as the aluminum containing precursor following the $La(thd)_3$/ozone sequence. The TMA is pulsed to the surface of the substrate 210 through gas-distribution fixture 240 from gas source 253 by mass-flow controller 258. The TMA is introduced onto the lanthanum oxide film formed during the $La(thd)_3$/ozone sequence.

At 335, a second purging gas is introduced into the system. For a TMA precursor, purified argon is used as a purging and carrier gas. The argon flow is controlled by mass-flow controller 267 from the purging gas source 262 into the gas conduit 270 and subsequently into the reaction chamber 220. Following the argon purge, at 340, a second oxygen containing precursor is pulsed into the reaction chamber 220. For the aluminum sequence using TMA as the precursor, distilled water vapor is selected as the precursor acting as an oxidizing reactant to interact with the TMA on the substrate 210. The distilled water vapor is pulsed into the reaction chamber 220 through gas conduit 270 from gas source 254 by mass-flow controller 259. The distilled water vapor aggressively reacts at the surface of substrate 210 to form a $LaAlO_3$ film.

Following the pulsing of the distilled water vapor acting as an oxidizing reactant, at 345, the second purging gas is injected into the reaction chamber 200. In the TMA/distilled water vapor sequence, argon gas is used to purge the reaction chamber after pulsing each precursor gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286. This completes not only the TMA/distilled water vapor sequence, but it also completes a lanthanum sequence/aluminum sequence cycle forming a $LaAlO_3$ layer having a set thickness associated with one ALD cycle.

During the TMA/distilled water vapor sequence, the substrate is held between about 350° C. and about 450° C. by the heating element 230. The reaction chamber is maintained at about 150° C. to minimize reactant condensation. The process pressure is maintained at about 230 mTorr during the pulsing of the precursor gases and at about 200 mTorr for the purging gases. Pulse times for the TMA and the distilled water vapor were about 1 sec for both precursors, with purging pulse times of about 15 secs. In one embodiment, the substrate temperature is maintained at about 350° C. for the complete $La(thd)_3$/ozone/TMA/distilled water vapor cycle. In another embodiment, the substrate temperature is maintained at about 425° C. for the complete $La(thd)_3$/ozone/TMA/distilled water vapor cycle.

As an alternate aluminum sequence, a DMEAA/oxygen sequence can be employed rather than the TMA/distilled water vapor sequence. The aluminum containing precursor DMEAA is an adduct of alane ($AlH_3$) and dimethylethylamine $[N(CH_3)_2(C_2H_5)]$. At 330, the DMEAA is pulsed to the substrate 210 surface form gas source 253. The DMEAA gas can be provided to gas source 253 through a bubbler-type evaporation controlled at 25° C. The purging and carrier gas associated with DMEAA, at 335, is hydrogen from purging gas source 262. At 340, to provide the necessary reaction at the substrate 210, oxygen as the second oxygen containing precursor is pulsed into the reaction chamber 220 from gas source 254. At 345, hydrogen purging gas is again flowed through the reaction chamber 220 from purging gas source 262.

During the DMEAA/oxygen sequence, the substrate is held between about 100° C. and about 125° C. by the heating element 230. The process pressure during the DMEAA/oxygen sequence is maintained at about 30 mTorr.

In an alternate aluminum sequence using DMEAA, a DMEAA/distilled water vapor sequence can used under the same temperature and pressure ranges as the TMA/distilled water sequence. In an embodiment of the present invention, the substrate temperature is maintained at about 350° C. for the complete $La(thd)_3$/ozone/DMEAA/distilled water vapor cycle. Alternately, the complete $La(thd)_3$/ozone/DMEAA/distilled water vapor cycle can be performed with the substrate temperature maintained at about 425° C.

The thickness of a $LaAlO_3$ film after one cycle is determined by the pulsing periods used in the lanthanum sequence and the aluminum sequence at a given temperature. The pulsing periods of the ALD process depend upon the characteristics of the reaction system 200 employed and the precursor and purging sources. Typically, at a given temperature, the pulsing periods can vary over a significant range above some minimum pulse time for the precursors, without substantially altering the growth rate. Once a set of periods for one cycle is determined, the growth rate for the $LaAlO_3$ film will be set at a value such as N nm/cycle. For a desired $LaAlO_3$ film thickness, t, in an application such as forming a gate dielectric of a MOS transistor, the ALD process should be repeated for t/N cycles.

At 350, it is determined whether the $LaAlO_3$ film is of the desired thickness, t. As mentioned, the desired thickness should be completed after t/N cycles. If less than t/N cycles have been completed, the process starts over at 310 with the pulsing of the precursor containing lanthanum, which in the embodiment discussed above is a $La(thd)_3$ gas. If t/N cycles have completed, no further ALD processing is requires and the $LaAlO_3$ film, at 355, is annealed. The annealing is a final heating cycle for producing the $LaAlO_3$ film and is performed at a temperature between about 850° C. and about 950° C. to produce optimum performance as a dielectric insulator. The annealing can be performed in an oxygen or nitrogen atmosphere.

At 360, after forming the $LaAlO_3$ film, processing the device containing the $LaAlO_3$ film is completed. In one embodiment, completing the device includes completing the formation of a transistor. Alternately, completing the process includes completing the formation of a memory device having a array with access transistors formed with $LaAlO_3$ film gate dielectrics. Further, in another embodiment, completing the process includes the formation of an information handling device that uses electronic devices with transistors formed with $LaAlO_3$ film gate dielectrics. Typically, information handling devices include many memory devices, having many access transistors.

In accordance with the present invention, a $LaAlO_3$ film for use as a gate dielectric forms on body region of a transistor by the ALD process using a lanthanum/ozone/aluminum/water cycle. This cycle is the combination of a lanthanum/ozone sequence and an aluminum/water sequence. Terminating the cycle at the end of a lanthanum/ozone sequence would result in a $La_2O_3$ film. Performing just an aluminum/water sequence would result in an $Al_2O_3$ film.

In a recent article by M. Nieminen et al., *Applied Surface Science*, vol. 174, pp. 155–165 (2001), growth of $La_2O_3$ films by ALD using a $La(thd)_3$/ozone sequence was reported. The best results for growing $La_2O_3$ films occurred for substrate temperatures above 300° C. to 400° C. However, after processing, the films were found to be relatively unstable in ambient air. The study also found that at a processing temperature of about 250° C., the growth rate was relatively stable at 0.36 Å per cycle as the pulse time of the La(thd)$_3$ varied from 0.5 to 1.5 seconds. However, the growth rate at a processing temperature of about 250° C. was significantly less if the pulse time for the ozone was less than one second. At a ozone pulse rate of 1 sec or greater, the growth rate saturated at 0.36 Å per cycle. Though the growth rate remained relatively constant at 0.36 Å per cycle over the temperature range of about 225° C. to about 275° C., the growth rate was found to increase with deposition temperature. At about 350° C., the growth rate was interpolated to be about 0.65 Å per cycle, while at about 425° C., the growth was interpolated to be about 1.48 Å per cycle. However, as noted above, the film thickness is linear with respect to the number of deposition cycles at a fixed processing temperature.

In a recent article by Y. Kim et al., *Applied Physics Letters*, vol. 71 (25), pp. 3604–3606 (1997), growth of Al$_2$O$_3$ films by ALD using a TMA/distilled water vapor sequence was reported. With the substrate temperature maintained at 370° C., and the pulsing time for the TMA and the distilled water vapor set each at 1 second, the growth rate for the Al$_2$O$_3$ films was determined to be about 0.19 m per cycle. This growth rate was determined to be the same for TiN, Si, and SiO$_2$ substrates. An Al$_2$O$_3$ growth rate of 24.4 Å per cycle at 100° C. by ALD using DMEAA and oxygen as precursors was reported in a recent article by C. Jeong et al., *Japanese Journal of Applied Physics*, vol. 40 part 1 no. 1, pp. 285–289 (2001). Typically, Al$_2$O$_3$ films formed by ALD are amorphous.

A LaAlO$_3$ dielectric film will have a dielectric constant in the range of about 21 to about 25. However, a dielectric film containing LaAlO$_3$, Al$_2$O$_3$, and La$_2$O$_3$ will have a dielectric constant ranging from the dielectric constant of Al$_2$O$_3$, 9, to the dielectric constant of La$_2$O$_3$, 30. By controlling the number of cycles of the lanthanum sequence and the number of cycles of the aluminum sequence, the amount of lanthanum and aluminum deposited on the surface region of a substrate can be controlled. Thus, a dielectric film formed by ALD using a lanthanum sequence and a aluminum sequence can be formed with a composition containing selected or predetermined percentages of LaAlO$_3$, Al$_2$O$_3$, and La$_2$O$_3$, in which case the effective dielectric constant of the film will be selected or predetermined in the range from 9 to 30. A dielectric film formed in accordance with the present invention containing almost entirely LaAlO$_3$ will have a dielectric constant in the range of about 21 to about 25. Furthermore, using an aluminum sequence subsequent to a lanthanum sequence, the resulting dielectric containing LaAlO$_3$ should be amorphous.

In addition to separately controlling the number of cycles of the lanthanum sequence and the aluminum sequence in the ALD process, a dielectric film containing LaAlO$_3$ can be engineered with selected characteristics by also controlling precursor materials for each sequence, processing temperatures and pressures for each sequence, individual precursor pulsing times, and heat treatment at the end of the process, at the end of each cycle, and at the end of each sequence. The heat treatment may include in situ annealing in various atmospheres including argon, nitrogen, and oxygen. The pulsing times for precursors range from about 0.5 sec to about 2 to 3 sec, though longer pulses can be employed. Typically, pulsing times for purging gases will range from a time equal to its associated precursor pulse time to an order of magnitude larger than the associated precursor pulse time in order than all excess material and by-products be purged from the reaction system. Generally, the pulsing times for purging gases will range from about one sec to about 30 seconds. The growth rates for an engineered LaAlO$_3$ containing film will be controlled by the growth rates of the individual sequences and typically can be from about 0.72 Å per cycle to about 25 Å per cycle. Other growth rates may also be attained.

A range of equivalent oxide thickness, $t_{eq}$, attainable in accordance with the present invention is associated with the capability to provide a composition having a dielectric constant in the range form about 9 to about 30, and the capability to attain physical film thickness in the range of from about 0.5 to about 50 nm and above. The $t_{eq}$ range in accordance with the present invention are shown in the following

| | Physical Thickness t = 0.5 nm (5 Å) | Physical Thickness t = 1.0 nm (10 Å) | Physical Thickness t = 50 nm (500 Å) |
|---|---|---|---|
| κ | $t_{eq}$ (Å) | $t_{eq}$ (Å) | teq (A) |
| 9 | 2.17 | 4.33 | 216.67 |
| 21 | .93 | 1.86 | 92.86 |
| 25 | .78 | 1.56 | 78 |
| 30 | .65 | 1.3 | 65 |

LaAlO$_3$ in a bulk form at room temperature has a nearly cubic perovskite crystal structure with a lattice constant of 0.536 nm. Fortunately, the films grown by ALD have an amorphous form, though it is expected that a dimension for a monolayer of LaAlO$_3$ is related to its lattice constant in bulk form. At a physical thickness about 0.5 nm, $t_{eq}$ would be expected to range from about 2.2 Å to about 0.65 Å for the dielectric constant ranging from 9 to 30. For a layer of essentially LaAlO$_3$, $t_{eq}$ would be expected to range from about 0.93 Å to about 0.78 Å for a physical layer of 0.5 nm. The lower limit on the scaling of a layer containing LaAlO$_3$ would depend on the monolayers of the film necessary to develop a full band gap such that good insulation is maintained between an underlying silicon layer and an overlying conductive layer to the LaAlO$_3$ film. This requirement is necessary to avoid possible short circuit effects between the underlying silicon layer and the overlying conductive layer. For a substantially LaAlO$_3$ film having a thickness of approximately 2 nm, $t_{eq}$ would range from about 3 Å to about 3.7 Å. From above, it is apparent that a film containing LaAlO$_3$ can be attained with a $t_{eq}$ ranging from 1.5 Å to 5 Å. Further, such a film can provide a $t_{eq}$ significantly less than 2 or 3 Å, even less than 1.5 Å.

The novel process described above provides significant advantages by performing atomic layer deposition with a lanthanum sequence/aluminum sequence deposition cycle. Further, by independently controlling the various parameters for each sequence a gate dielectric with a selected dielectric constant can be formed. Additionally, the novel process can be implemented to form transistors, memory devices, and information handling devices.

A transistor 100 as depicted in FIG. 1 can be formed by forming a source/drain region 120 and another source/drain region 130 in a silicon based substrate 110 where the two source/drain regions 120, 130 are separated by a body region 132. The body region 132 separated by the source/drain 120 and the source/drain 130 defines a channel having a channel length 134. A LaAlO$_3$ film is formed by ALD by pulsing a lanthanum containing precursor into a reaction chamber containing the substrate 110, pulsing a first oxygen containing precursor into the reaction chamber, pulsing an aluminum containing precursor into the reaction chamber, and pulsing a second oxygen containing precursor into the reaction chamber. Each precursor is pulsed into the reaction chamber for a selected time period. A length of time for pulsing each precursor is selected according to the precursor used. Between each precursor pulsing, precursor excess and reaction by-products are removed from the reaction. The $LaAlO_3$ film thickness is controlled by repeating for a number of cycles the pulsing of the lanthanum containing precursor, the first oxygen containing precursor, the aluminum containing precursor, and the second oxygen containing precursor until the desired thickness for film 140 containing $LaAlO_3$ is formed on the body region. A gate is formed over the gate dielectric 140. Typically, forming the gate includes forming a polysilicon layer, though a metal gate can be formed in an alternative process. Forming the substrate, source/region regions, and the gate is performed using standard processes known to those skilled in the art. Additionally, the sequencing of the various elements of the process for forming a transistor is conducted with standard fabrication processes, also as known to those skilled in the art.

Figure 4:
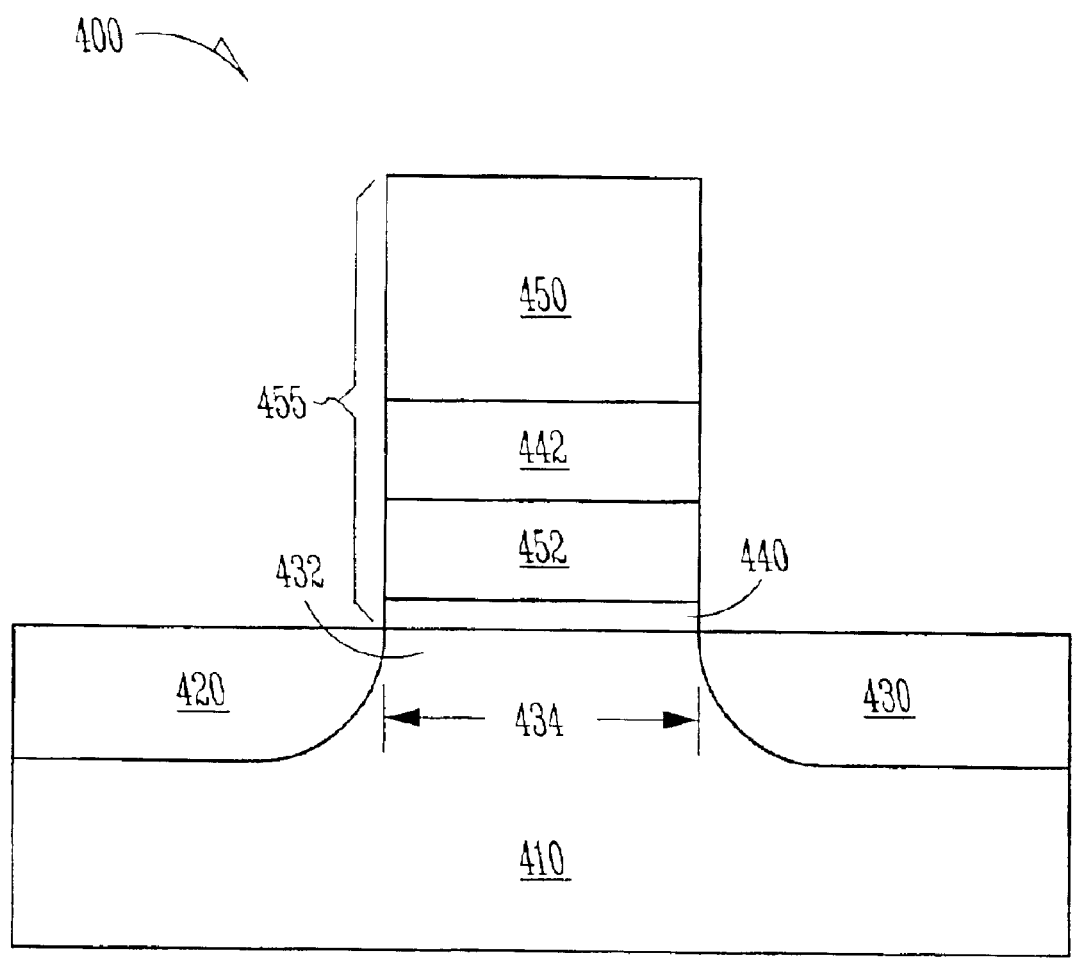
FIG. 4 depicts a configuration of a transistor capable of being fabricated in accordance with the present invention.

The method of forming a $LaAlO_3$ film by ALD as a gate dielectric in accordance with the present invention can be applied to other transistor structures having dielectric layers. For example, the structure of FIG. 4 depicts a transistor 400 having a silicon based substrate 410 with two source/drain regions 420, 430 separated by a body region 432. The body region 432 between the two source/drain regions 420, 430 defines a channel region having a channel length 434. Located above the body region 432 is a stack 455 including a gate dielectric 440, a floating gate 452, a floating gate dielectric 442, and control gate 450. The gate dielectric 440 is formed in an ALD process according to the teachings of the present invention as described above with the remaining elements of the transistor 400 formed using processes known to those skilled in the art. Alternately, both the gate dielectric 440 and the floating gate dielectric 442 can be formed by ALD in accordance with the present invention as described above.

Figure 5:
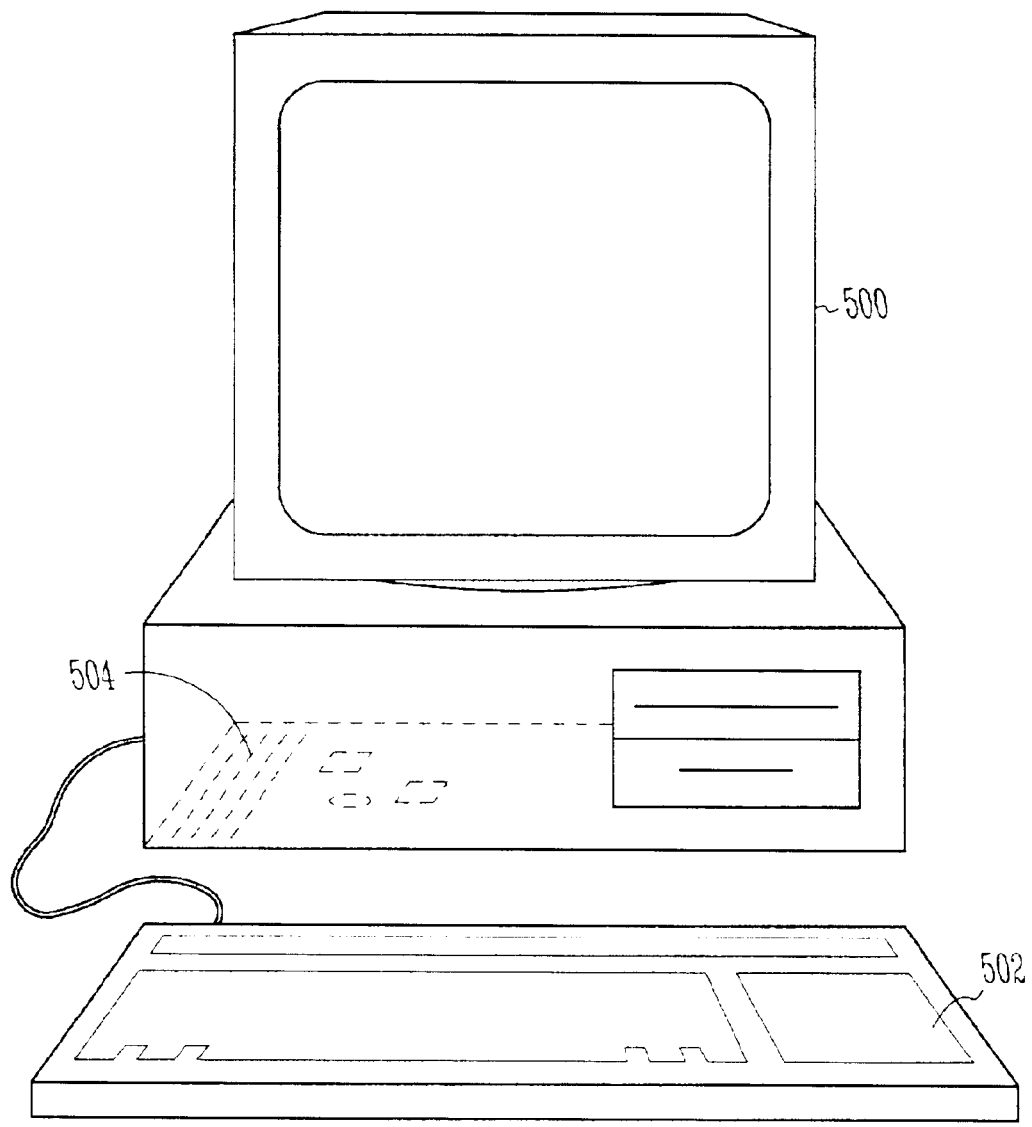
FIG. 5 depicts a perspective view of a personal computer incorporating devices made in accordance with the present invention.
Figure 6:
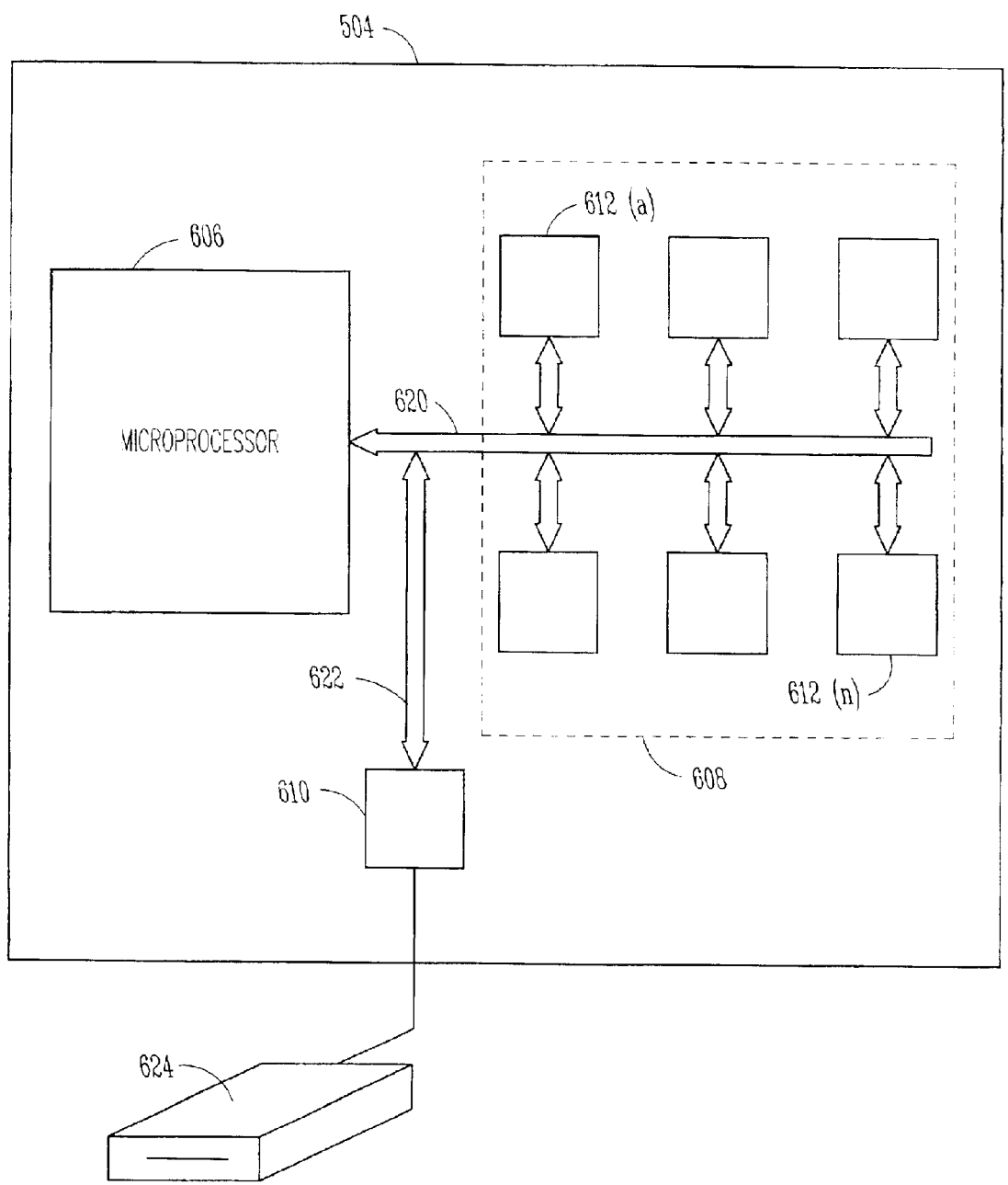
FIG. 6 depicts a schematic view of a central processing unit incorporating devices made in accordance with the present invention.
Figure 7:
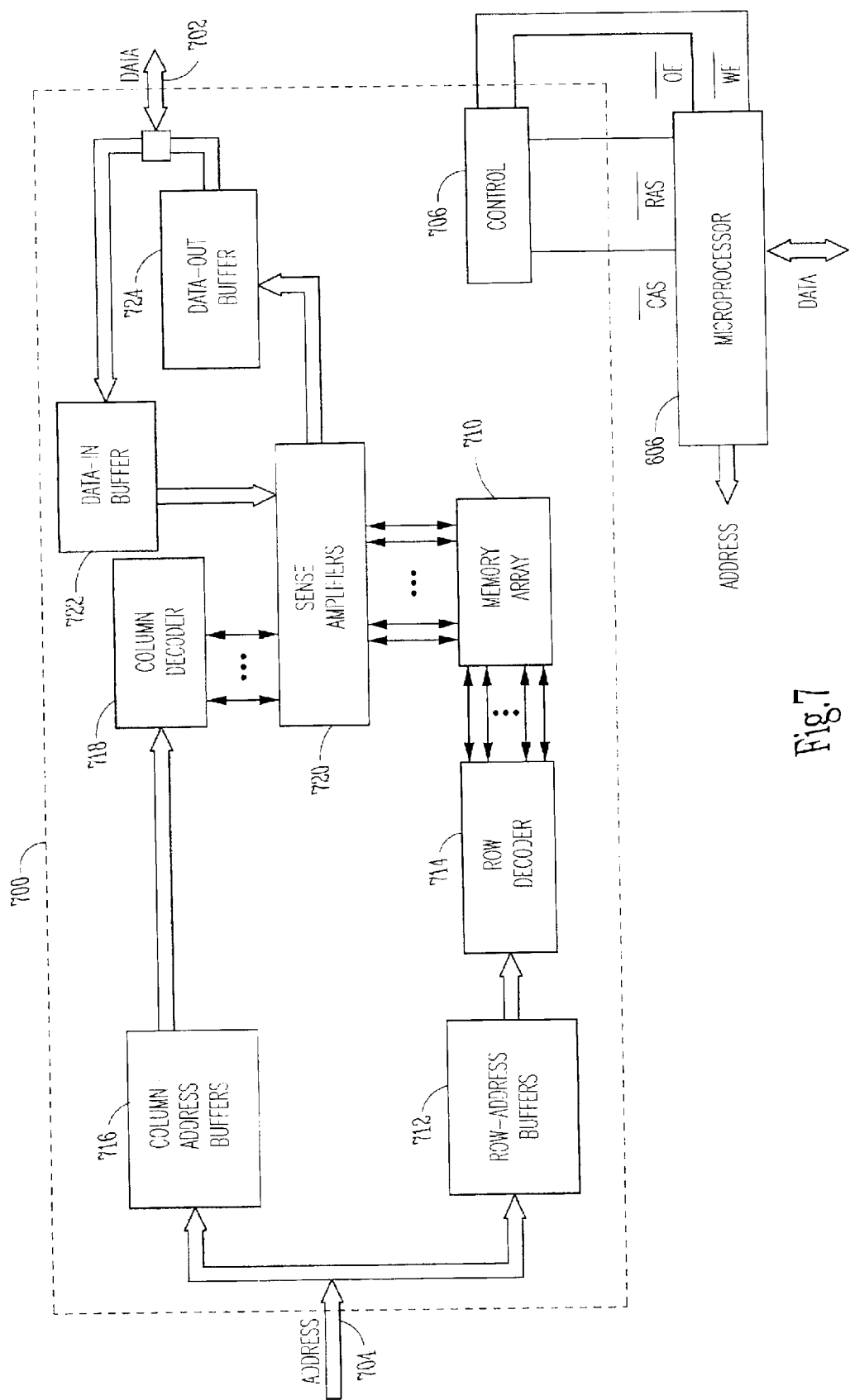
FIG. 7 shows a schematic view of a DRAM memory device in accordance with the present invention.

Transistors created by the methods described above may be implemented into memory devices and information handling devices as shown in FIGS. 5–7 and described below. While specific types of memory devices and computing devices are shown below, it will be recognized by one skilled in the art that several types of memory devices and information handling devices could utilize the invention.

A personal computer, as shown in FIGS. 5 and 6, include a monitor 500, keyboard input 502 and a central processing unit 504. The processor unit 504 typically includes microprocessor 606, memory bus circuit 608 having a plurality of memory slots 612(a–n), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate dielectric according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(a–n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(a–n). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 6 includes at least one transistor having a gate dielectric according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common word line. The word line is coupled to gates of individual transistors, where at least one transistor has a gate coupled to a gate dielectric containing $LaAlO_3$ in accordance with the method and structure previously described above. Additionally, each memory cell in a column is coupled to a common bit line. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a word line driver, an address decoder tree, and circuitry which translates a given row address received from row address buffers 712 and selectively activates the appropriate word line of memory array 710 via the word line drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bit lines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 720 detects and amplifies a difference in voltage between the complementary bit lines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

A gate dielectric containing $LaAlO_3$ and method of fabricating a gate dielectric contained $LaAlO_3$ are provided that produces a reliable gate dielectric having a thinner equivalent oxide thickness than attainable using $SiO_2$. $LaAlO_3$ gate dielectrics formed using the methods described herein are thermodynamically stable such that the gate dielectrics formed will have minimal reactions with a silicon substrate or other structures during processing.

Transistors and higher level ICs or devices are provided utilizing the novel gate dielectric and process of formation. Gate dielectric layers containing $LaAlO_3$ are formed having a high dielectric constant (κ), where the gate dielectrics are capable of a $t_{eq}$ thinner than 5 Å, thinner than the expected limit for $SiO_2$ gate dielectrics. At the same time, the physical thickness of the $LaAlO_3$ layer is much larger than the $SiO_2$ thickness associated with the $t_{eq}$ limit of $SiO_2$. Forming the larger thickness provides advantages in processing the gate dielectric. In addition forming a dielectric containing $LaAlO_3$, $Al_2O_3$, and $La_2O_3$ through controlling a lanthanum sequence and a aluminum sequence in an ALD processing of a substrate allows the selection of a dielectric constant ranging from that of $Al_2O_3$ to the dielectric constant of $La_2O_3$.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a dielectric film comprising:
    pulsing a lanthanum containing precursor into a reaction chamber containing a substrate;
    pulsing an aluminum containing precursor into the reaction chamber; and
    controlling the pulsing of the lanthanum containing precursor and the pulsing of the aluminum containing precursor to form by atomic layer deposition a dielectric layer containing $LaAlO_3$ with a predetermined dielectric constant.

2. The method of claim 1, wherein pulsing a lanthanum containing precursor into a reaction chamber is followed by pulsing a first oxygen containing precursor into the reaction chamber.

3. The method of claim 1, wherein pulsing an aluminum containing precursor into the reaction chamber is followed by pulsing a second oxygen containing precursor into the reaction chamber.

4. The method of claim 1, wherein the substrate is maintained at a selected temperature for each pulsing of a precursor, the selected temperature set independently for pulsing each precursor.

5. The method of claim 1, wherein each pulsing of a precursor is followed by purging the reaction chamber with a purging gas.

6. The method of claim 1, further comprising repeating for a number of cycles the pulsing of the lanthanum containing precursor, and the aluminum containing precursor.

7. A method of forming a dielectric film comprising:
    pulsing a lanthanum containing source gas into a reaction chamber containing a substrate;
    pulsing a first oxygen containing source gas into the reaction chamber;
    pulsing an aluminum containing source gas into the reaction chamber;
    pulsing a second oxygen containing source gas into the reaction chamber; and
    controlling the pulsing of the lanthanum containing precursor and the pulsing of the aluminum containing precursor to form by atomic layer deposition a dielectric layer containing $LaAlO_3$ with a predetermined dielectric constant.

8. The method of claim 7, wherein the first oxygen containing source gas includes ozone.

9. The method of claim 7, wherein the second oxygen containing source gas includes distilled water vapor.

10. The method of claim 7, wherein the second oxygen containing source gas includes oxygen.

11. The method of claim 7, wherein a pulsing period of time, a number of times the source is pulsed into the substrate, and a substrate temperature are independently controlled for each source gas.

12. The method of claim 11, wherein the pulsing period of time, the number of times the source is pulsed into the substrate, and the substrate temperature are controlled for each source gas to form a dielectric film containing LaAlO$_3$, the dielectric film having a dielectric constant in the range from about 9 to about 30.

13. The method of claim 7, further comprising repeating for a number of cycles the pulsing of the lanthanum containing source gas, the first oxygen containing source gas, the aluminum containing source gas, and the second oxygen containing source gas.

14. The method of claim 13, wherein repeating for a number of cycles the pulsing of the lanthanum containing source gas, the first oxygen containing source gas, the aluminum containing source gas, and the second oxygen containing source gas is followed by annealing at a temperature ranging from about 800° C. to about 900° C.

15. A method of forming a dielectric film comprising:
pulsing a La(thd)$_3$ (thd=2,2,6,6-tetramethyl-3,5-heptanedione) source gas into a reaction chamber containing a substrate;
pulsing a first oxygen containing source gas into the reaction chamber;
pulsing an aluminum containing source gas into the reaction chamber; and
pulsing a second oxygen containing source gas into the reaction chamber to form a dielectric film containing LaAlO$_3$ by atomic layer deposition.

16. The method of claim 16, wherein pulsing a La(thd)$_3$ (thd=2,2,6,6-tetramethyl-3,5-heptanedione) source gas into a reaction chamber is perfonned with the substrate maintained at a temperature ranging from about 180 ° C. to about 425 ° C.

17. The method of claim 16, wherein pulsing a La(thd)$_3$ (thd=2,2,6,6-tetramethyl-3,5-heptanedione) source gas into a reaction chamber is performed at a pressure ranging from about 2 mbar to about 3 mbar.

18. The method of claim 15, wherein a pulsing period of time, a number of times the source is pulsed into the substrate, and a substrate temperature are independently controlled for each source gas.

19. The method of claim 18, wherein the pulsing period of time, the number of times the source is pulsed into the substrate, and the substrate temperature are controlled for each source gas to form a dielectric film containing LaAlO$_3$, the dielectric film having a dielectric constant in the range from about 9 to about 30.

20. A method of forming a dielectric film comprising:
pulsing a lanthanum containing source gas into a reaction chamber containing a substrate;
pulsing a first oxygen containing source gas into the reaction chamber;
pulsing a trimethylaluminum source gas into the reaction chamber; and
pulsing a second oxygen containing source gas into the reaction chamber to form a dielectric film containing LaAlO$_3$ by atomic layer deposition.

21. The method of claim 20, wherein pulsing the trimethylaluminum source gas into the reaction chamber is performed with the substrate maintained at a temperature ranging from about 350° C. to about 370° C. with the reaction chamber having chamber walls maintained at about 150° C.

22. The method of claim 21, wherein pulsing a trimethylaluminum source gas into the reaction chamber is performed at a pressure of about 230 mTorr.

23. The method of claim 20, wherein a pulsing period of time, a number of times the source is pulsed into the substrate, and a substrate temperature are independently controlled for each source gas.

24. The method of claim 23, wherein the pulsing period of time, the number of times the source is pulsed into the substrate, and the substrate temperature are controlled for each source gas to form a dielectric film containing LaAlO$_3$, the dielectric film having a dielectric constant in the range from about 9 to about 30.

25. A method of forming a dielectric film comprising:
pulsing a lanthanum containing source gas into a reaction chamber containing a substrate;
pulsing a first oxygen containing source gas into the reaction chamber;
pulsing a DMEAA source gas into the reaction chamber; and
pulsing a second oxygen containing source gas into the reaction chamber to form a dielectric film containing LaAlO$_3$ by atomic layer deposition.

26. The method of claim 25, wherein pulsing a DMEAA source gas into the reaction chamber is performed with the substrate maintained at a temperature ranging from about 100 ° C. to about 125° C.

27. The method of claim 26, wherein pulsing a DMEAA source gas into the reaction chamber is performed at a pressure of about 30 mTorr.

28. The method of claim 25, wherein a pulsing period of time, a number of times the source is pulsed into the substrate, and a substrate temperature are independently controlled for each source gas.

29. The method of claim 31, wherein the pulsing period of time, the number of times the source is pulsed into the substrate, and the substrate temperature are controlled for each source gas to form a dielectric film containing LaAlO$_3$, the dielectric film having a dielectric constant in the range from about 9 to about 30.

30. A method of forming a dielectric film comprising:
pulsing a La(thd)$_3$ (thd=2,2,6,6-tetramethyl-3,5-heptanedione) source gas into a reaction chamber containing a substrate;
pulsing a first oxygen containing source gas into the reaction chamber;
pulsing a trimethylaluminum source gas into the reaction chamber; and
pulsing a second oxygen containing source gas into the reaction chamber to form a dielectric film containing LaAlO$_3$ by atomic layer deposition.

31. The method of claim 30, wherein pulsing a La(thd)$_3$ (thd=2,2,6,6-tetramethyl-3,5-heptanedione) source gas into a reaction chamber is followed by purging the reaction chamber with nitrogen.

32. The method of claim 31, wherein pulsing a trimethylaluminum source gas into the reaction chamber is followed by purging the reaction chamber with argon.

33. A method of forming a dielectric film comprising:
pulsing a La(thd)$_3$ (thd=2,2,6,6-tetramethyl-3,5-heptanedione) source gas into a reaction chamber containing a substrate;
pulsing a first oxygen containing source gas into the reaction chamber;
pulsing a DMEAA source gas into the reaction chamber; and
pulsing a second oxygen containing source gas into the reaction chamber to form a dielectric film containing LaAlO$_3$ by atomic layer deposition.

34. The method of claim 33, wherein pulsing a La(thd)$_3$ (thd=2,2,6,6-tetramethyl-3,5-heptanedione) source gas into a reaction chamber is followed by purging the reaction chamber with nitrogen.

35. The method of claim 33, wherein pulsing a DMEAA source gas into the reaction chamber is followed by purging the reaction chamber with hydrogen.

36. A method of forming a transistor, comprising:
forming first and second source/drain regions in a substrate;
forming a body region between the first and second source/drain regions;
forming a film on the body region between the first and second source/drain regions, comprising:
pulsing a lanthanum containing precursor into a reaction chamber containing the substrate;
pulsing a first oxygen containing precursor into the reaction chamber;
pulsing an aluminum containing precursor into the reaction chamber;
pulsing a second oxygen containing precursor into the reaction chamber; and
controlling the pulsing of the lanthanum containing precursor and the pulsing of the aluminum containing precursor to form by atomic layer deposition a dielectric layer containing $LaAlO_3$ with a predetermined dielectric constant; and
coupling a gate to the film containing $LaAlO_3$.

37. The method of claim 36, wherein pulsing a lanthanum containing precursor into a reaction chamber includes pulsing a $La(thd)_3$ (thd=2,2,6,6-tetramethyl-3,5-heptanedione) source gas into the reaction chamber.

38. The method of claim 36, wherein pulsing an aluminum containing precursor into the reaction chamber includes pulsing a DMEAA source gas into the reaction chamber.

39. The method of claim 36, wherein pulsing an aluminum containing precursor into the reaction chamber includes pulsing a trimethylaluminum source gas into the reaction chamber.

40. A method of forming a memory array, comprising:
forming a number of access transistors, comprising:
forming first and second source/drain regions;
forming a body region between the first and second source/drain regions;
forming a film containing $LaAlO_3$ on the body region between the first and second source/drain regions, comprising:
pulsing a lanthanum containing source gas into a reaction chamber containing a substrate;
pulsing a first oxygen containing source gas into the reaction chamber;
pulsing an aluminum containing source gas into a reaction chamber; and
pulsing a second oxygen containing source gas into the reaction chamber; and
controlling the pulsing of the lanthanum containing source gas and the pulsing of the aluminum containing source gas to form by atomic layer deposition a dielectric layer containing $LaAlO_3$ with a predetermined dielectric constant; and
coupling a gate to the film containing $LaAlO_3$;
forming a number of word lines coupled to a number of the gates of the number of access transistors;
forming a number of source lines coupled to a number of the first source/drain regions of the number of access transistors; and
forming a number of bit lines coupled to a number of the second source/drain regions of the number of access transistors.

41. The method of claim 40, wherein pulsing a lanthanum containing precursor into a reaction chamber includes pulsing a $La(thd)_3$ (thd=2,2,6,6-tetramethyl-3,5-heptanedione) source gas into the reaction chamber.

42. The method of claim 41, wherein pulsing an aluminum containing precursor into the reaction chamber includes pulsing a DMEAA source gas into the reaction chamber.

43. The method of claim 41, wherein pulsing an aluminum containing precursor into the reaction chamber includes pulsing a trimethylaluminum source gas into the reaction chamber.

44. A method of forming an information handling system, comprising:
providing a processor;
providing a memory array, wherein the memory array is formed by a method comprising:
forming a number of access transistors, comprising:
forming first and second source/drain regions;
forming a body region between the first and second source/drain regions;
forming a film containing $LaAlO_3$ on the body region between the first and second source/drain regions, comprising:
pulsing a lanthanum containing source gas into a reaction chamber containing a substrate;
pulsing an aluminum containing source gas into a reaction chamber; and
controlling the pulsing of the lanthanum containing source gas and the pulsing of the aluminum containing source gas to form by atomic layer deposition a dielectric layer containing $LaAlO_3$ with a predetermined dielectric constant; and
coupling a gate to the film containing $LaAlO_3$;
forming a number of word lines coupled to a number of the gates of the number of access transistors;
forming a number of source lines coupled to a number of the first source/drain regions of the number of access transistors;
forming a number of bit lines coupled to a number of the second source/drain regions of the number of access transistors; and
coupling the processor to the memory array using a system bus.

45. The method of claim 44, wherein pulsing a lanthanum containing precursor into a reaction chamber includes pulsing a $La(thd)_3$ (thd=2,2,6,6-tetramethyl-3,5-heptanedione) source gas into the reaction chamber.

46. The method of claim 44, wherein pulsing an aluminum containing precursor into the reaction chamber includes pulsing a DMEAA source gas into the reaction chamber.

47. The method of claim 44, wherein pulsing an aluminum containing precursor into the reaction chamber includes pulsing a trimethylaluminum source gas into the reaction chamber.

48. A method of forming a transistor, comprising:
forming first and second source/drain regions in a substrate;
forming a body region between the first and second source/drain regions;
forming a film on the body region between the first and second source/drain regions, comprising:
pulsing a $La(thd)_3$ (thd=2,2,6,6-tetramethyl-3,5-heptanedione) precursor into a reaction chamber containing the substrate;
pulsing a first oxygen containing precursor into the reaction chamber;

pulsing an aluminum containing precursor into the reaction chamber;
pulsing a second oxygen containing precursor into the reaction chamber to form a dielectric film containing LaAlO$_3$ by atomic layer deposition; and
coupling a gate to the film containing LaAlO$_3$.

49. A method of forming a transistor, comprising:
forming first and second source/drain regions in a substrate;
forming a body region between the first and second source/drain regions;
forming a film on the body region between the first and second source/drain regions, comprising:
pulsing a lanthanum containing precursor into a reaction chamber containing the substrate;
pulsing a first oxygen containing precursor into the reaction chamber;
pulsing an aluminum containing precursor into the reaction chamber;
pulsing a second oxygen containing precursor into the reaction chamber to form a dielectric film containing LaAlO$_3$ by atomic layer deposition, wherein the aluminum containing precursor is selected from a group consisting of a DMEAA precursor and a trimethylaluminum precursor and
coupling a gate to the film containing LaAlO$_3$.

50. A method of forming a memory array, comprising:
forming a number of access transistors, comprising:
forming first and second source/drain regions;
forming a body region between the first and second source/drain regions;
forming a film on the body region between the first and second source/drain regions, comprising:
pulsing a La(thd)$_3$ (thd=2,2,6,6-tetramethyl-3,5-heptanedione) source gas into a reaction chamber containing a substrate;
pulsing a first oxygen containing source gas into the reaction chamber;
pulsing an aluminum containing source gas into a reaction chamber; and
pulsing a second oxygen containing source gas into the reaction chamber to form a dielectric film containing LaAlO$_3$ by atomic layer deposition; and
coupling a gate to the film containing LaAlO$_3$;
forming a number of word lines coupled to a number of the gates of the number of access transistors;
forming a number of source lines coupled to a number of the first source/drain regions of the number of access transistors; and
forming a number of bit lines coupled to a number of the second source/drain regions of the number of access transistors.

51. A method of forming a memory array, comprising:
forming a number of access transistors, comprising:
forming first and second source/drain regions;
forming a body region between the first and second source/drain regions;
forming a film on the body region between the first and second source/drain regions, comprising:
pulsing a lanthanum containing source gas into a reaction chamber containing a substrate;
pulsing a first oxygen containing source gas into the reaction chamber;
pulsing an aluminum containing source gas into a reaction chamber; and
pulsing a second oxygen containing source gas into the reaction chamber to form a dielectric film containing LaAlO$_3$ by atomic layer deposition, wherein the aluminum containing source gas is selected from a group consisting of a DMEAA source gas and a trimethylaluminum source gas; and
coupling a gate to the film containing LaAlO$_3$;
forming a number of word lines coupled to a number of the gates of the number of access transistors;
forming a number of source lines coupled to a number of the first source/drain regions of the number of access transistors; and
forming a number of bit lines coupled to a number of the second source/drain regions of the number of access transistors.

52. A method of forming an information handling system, comprising:
providing a processor; and
coupling a memory array to the processor using a system bus, wherein forming the memory array includes:
forming a number of access transistors, comprising:
forming first and second source/drain regions;
forming a body region between the first and second source/drain regions;
forming a film on the body region between the first and second source/drain regions, comprising:
pulsing a La(thd)$_3$ (thd=2,2,6,6-tetramethyl-3,5-heptanedione) source gas into a reaction chamber containing a substrate;
pulsing an aluminum containing source gas into a reaction chamber to form a dielectric film containing LaAlO$_3$ by atomic layer deposition; and
coupling a gate to the film containing LaAlO$_3$;
forming a number of word lines coupled to a number of the gates of the number of access transistors;
forming a number of source lines coupled to a number of the first source/drain regions of the number of access transistors; and
forming a number of bit lines coupled to a number of the second source/drain regions of the number of access transistors.

53. A method of forming an information handling system, comprising:
providing a processor; and
coupling a memory array to the processor using a system bus, wherein forming the memory array includes:
forming a number of access transistors, comprising:
forming first and second source/drain regions;
forming a body region between the first and second source/drain regions;
forming a film on the body region between the first and second source/drain regions, comprising:
pulsing a lanthanum containing source gas into a reaction chamber containing a substrate;
pulsing an aluminum containing source gas into a reaction chamber to form a dielectric film containing LaAlO$_3$ by atomic layer deposition, wherein the aluminum containing source gas is selected from a group consisting of a DMEAA source gas and a trimethylaluminum source gas; and
coupling a gate to the film containing LaAlO$_3$;

forming a number of word lines coupled to a number of the gates of the number of access transistors;

forming a number of source lines coupled to a number of the first source/drain regions of the number of access transistors; and forming a number of bit lines coupled to a number of the second source/drain regions of the number of access transistors.

* * * * *

UNITED STATES PATENT AND TRADEMARK OFFICE
CERTIFICATE OF CORRECTION

PATENT NO.      : 7,045,430 B2
APPLICATION NO. : 10/137499
DATED           : May 16, 2006
INVENTOR(S)     : Ahn et al.

It is certified that error appears in the above-identified patent and that said Letters Patent is hereby corrected as shown below:

On the face page, in field (54), in "Title", in column 1, line 1, delete "LAALO$_3$" and insert -- LaAlO$_3$ --, therefor.

On the face page, in field (56), under "Foreign Patent Documents", in column 2, line 1, after "5/2001" insert -- C30B 25/02 --.

On the face page, in field (56), under "Foreign Patent Documents", in column 2, line 2, after "8/2001" insert – H01L 29/51 --.

On the face page, in field (56), under "Foreign Patent Documents", in column 2, line 3, after "12/1999" insert -- C23C 16/44 --.

On the face page, in field (56), under "Foreign Patent Documents", in column 2, line 4, after "11/2001" insert -- H01L 21/316 --.

On the face page, in field (56), under "Foreign Patent Documents", in column 2, line 5, after "WO-02/31875  4/2002" insert -- H01L 21/316 --.

On the face page, in field (56), under "Foreign Patent Documents", in column 2, line 6, after "WO-0233729 A2 4/2002" insert -- H01J 37/32 --.

On the face page, in field (56), under "Foreign Patent Documents", in column 2, line 7, after "WO-02/43115  5/2002" insert -- H0lL --, therefor.

On the face page, in field (56), under "Other Publications", in column 2, line 2, delete "SrTiO3/LaAlO3" and insert-- SrTiO$_3$/LaAlO$_3$ -- therefor.

On the face page, in field (56), under "Other Publications", in column 2, line 4, after "448." insert -- * --.

On Page 2, in field (56), under "U.S. Patent Documents", in column 1, line 5, after "5,840,897 A" insert -- * --.

On page 2, in field (56), under "U.S. Patent Documents", in column 1, line 12, after "6,057,271 A" insert -- * --.

On page 2, in field (56), under "U.S. Patent Documents", in column 1, line 14, after "6,110,529 A" insert -- * --.

UNITED STATES PATENT AND TRADEMARK OFFICE
CERTIFICATE OF CORRECTION

| | | |
|---|---|---|
| PATENT NO. | : 7,045,430 B2 | |
| APPLICATION NO. | : 10/137499 | |
| DATED | : May 16, 2006 | |
| INVENTOR(S) | : Ahn et al. | |

It is certified that error appears in the above-identified patent and that said Letters Patent is hereby corrected as shown below:

On page 2, in field (56), under "U.S. Patent Documents", in column 1, line 16, after "6,203,613 B1" insert -- * --.

On page 2, in field (56), under "U.S. Patent Documents", in column 1, line 27, after "6,380,579 B1" insert -- * --.

On page 2, in field (56), under "U.S. Patent Documents", in column 1, line 29, after "6,391,769 B1" insert -- * --.

On page 2, in field (56), under "U.S. Patent Documents", in column 1, line 33, after "6,432,779 B1" insert -- * --.

On page 2, in field (56), under "U.S. Patent Documents", in column 1, line 36, after "6,445,023 B1" insert -- * --.

On page 2, in field (56), under "U.S. Patent Documents", in column 1, line 41, after "6,458,701 B1" insert -- * --.

On page 2, in field (56), under "Other Publications", in column 2, line 26, delete "Si2H6" and insert -- $Si_2H_6$ --, therefor.

On page 2, in field (56), under "Other Publications", in column 2, lines 30-31, delete "ZrO2, HfO2, Y2O3 and Al2O3" and insert -- $ZrO_2$, $HfO_2$, $Y_2O_3$ and $Al_2O_3$ --, therefor.

On page 3, in field (56), under "Other Publications", in column 1, line 2, delete "TiO2" and insert -- $TiO_2$ --, therefor.

On page 3, in field (56), under "Other Publications", in column 1, line 5, delete "TiO2" and insert -- $TiO_2$ --, therefor.

On page 3, in field (56), under "Other Publications", in column 1, line 12, delete "Ba2YCu3O7-" and insert -- $Ba_2YCu_3O_7$-- , therefor.

On page 3, in field (56), under "Other Publications", in column 1, line 28, delete "mixedcerium" and insert -- mixed cerium --, therefor.

On page 3, in field (56), under "Other Publications", in column 1, line 31, delete "Al2O3" and insert -- $Al_2O_3$ --, therefor.

UNITED STATES PATENT AND TRADEMARK OFFICE
CERTIFICATE OF CORRECTION

PATENT NO. : 7,045,430 B2
APPLICATION NO. : 10/137499
DATED : May 16, 2006
INVENTOR(S) : Ahn et al.

It is certified that error appears in the above-identified patent and that said Letters Patent is hereby corrected as shown below:

On page 3, in field (56), under "Other Publications", in column 1, line 36, delete "Al2O3" and insert -- $Al_2O_3$ --, therefor.

On page 3, in field (56), under "Other Publications", in column 1, line 42, delete "H2O2" and insert -- $H_2O_2$--, therefor.

On page 3, in field (56), under "Other Publications", in column 1, line 47, delete "LaAlO3" and insert -- $LaAlO_3$ --, therefor.

On page 3, in field (56), under "Other Publications", in column 1, line 53, delete "Tio2" and insert -- $TiO_2$ --, therefor.

On page 3, in field (56), under "Other Publications", in column 1, lines 55-56, delete "mangetometer" and insert-- magnetometer --, therefor.

On page 3, in field (56), under "Other Publications", in column 2, line 2, delete "SiO2" and insert -- $SiO_2$ --, therefor.

On page 3, in field (56), under "Other Publications", in column 2, line 6, delete "LaAlO3" and insert-- $LaAlO_3$ --, therefor.

On page 3, in field (56), under "Other Publications", in column 2, line 14, delete "NH3" and insert -- $NH_3$ --, therefor.

On page 3, in field (56), under "Other Publications", in column 2, line 19, delete "ZrO2-SiO2 and HfO2-SiO2" and insert -- $ZrOr_2-SiO_2$ and $HfO_2-SiO_2$ --, therefor.

On page 3, in field (56), under "Other Publications", in column 2, line 30, delete "LaAlO3/Si" and insert -- $LaAlO_3/Si$ --, therefor.

On page 3, in field (56), under "Other Publications", in column 2, line 31, delete "Sr0.8Bi2.2Ta2O9/LaAlO3/Si" and insert -- $Sr_{0.8}Bi_{2.2}Ta_2O_9/LaAlO_3/Si$ --, therefor.

On page 3, in field (56), under "Other Publications", in column 2, line 34, delete "ZrO2" and insert -- $ZrO_2$ --, therefor.

On page 3, in field (56), under "Other Publications", in column 2, line 37, delete "ZrO2-SiO2" and insert -- $ZrO_2-SiO_2$ --, therefor.

UNITED STATES PATENT AND TRADEMARK OFFICE
CERTIFICATE OF CORRECTION

PATENT NO.       : 7,045,430 B2
APPLICATION NO.  : 10/137499
DATED            : May 16, 2006
INVENTOR(S)      : Ahn et al.

It is certified that error appears in the above-identified patent and that said Letters Patent is hereby corrected as shown below:

On page 3, in field (56), under "Other Publications", in column 2, line 56, delete "SiO2" and insert -- $SiO_2$ --, therefor.

On page 3, in field (56), under "Other Publications", in column 2, line 60, delete "Al2O3" and insert -- $Al_2O_3$ --, therefor.

On page 4, in field (56), under "Other Publications", in column 1, line 5, delete "Ta2O5" and insert -- $Ta_2O_5$ --, therefor.

On page 4, in field (56), under "Other Publications", in column 1, line 5, delete "Ta(OC2H5)5 and NH3" and insert -- $Ta(OC_2H_5)_5$ and $NH_3$ --, therefor.

On page 4, in field (56), under "Other Publications", in column 1, line 13, delete "LaAlO3"," and insert -- $LaAlO_3$", --, therefor.

On page 4, in column 2, line 18, below "227-231." insert -- * cited by examiner --.

On Sheet 1 of 8, in Fig. 1, delete "1.34" and insert -- 134 --, therefor.

On Sheet 4 of 8, in Fig. 3 (Reference Numeral - 360), line 2, delete "F'LM" and insert -- FILM --, therefor.

On Sheet 8 of 8, in Fig. 7 (Reference Numeral - 702), delete "DAIA" and insert -- DATA --, therefor.

In column 1, line 1, delete "LAALO$_3$" and insert -- $LaAlO_3$ --, therefor.

In column 1, lines 13-15, delete "Atomic Layer of $AlO_x$ for ULSI Gate Atomic Layer Deposition for Gate Dielectric Layer" and insert -- Systems And Apparatus For Atomic-Layer Deposition --, therefor.

In column 7, line 4, delete "surfactant-assited" and insert -- surfactant-assisted --, therefor.

In column 8, lines 61-62, delete "Atomic Layer of $AlO_x$ for ULSI Gate Atomic Layer Deposition for Gate Dielectric Layer" and insert -- Systems And Apparatus For Atomic-Layer Deposition --, therefor.

In column 9, line 62, delete "man" and insert -- may --, therefor.

UNITED STATES PATENT AND TRADEMARK OFFICE
CERTIFICATE OF CORRECTION

PATENT NO.        : 7,045,430 B2
APPLICATION NO. : 10/137499
DATED             : May 16, 2006
INVENTOR(S)       : Ahn et al.

It is certified that error appears in the above-identified patent and that said Letters Patent is hereby corrected as shown below:

In column 13, line 24, delete "0.19 m" and insert-- 0.19 nm --, therefor.

In column 14, line 20, delete "teq (A)" and insert -- $t_{eq}$ (Å) --, therefor.

In column 19, line 28, in Claim 16, delete "claim 16," and insert -- claim 15, --, therefor.

In column 19, line 30, in Claim 16, delete "perfonned" and insert -- performed --, therefor.

In column 20, line 30, in Claim 29, delete "claim 31," and insert -- claim 28, --, therefor.

In column 23, line 25, in Claim 49, delete "precursor" and insert -- precursor; --, therefor.

Signed and Sealed this

Fifth Day of December, 2006

JON W. DUDAS
*Director of the United States Patent and Trademark Office*